United States Patent
Miyake et al.

(10) Patent No.: US 9,577,008 B2
(45) Date of Patent: Feb. 21, 2017

(54) DISPLAY DEVICE AND DRIVING METHOD OF THE SAME

(71) Applicant: Semiconductor Energy Laboratory Co., Ltd., Kanagawa-ken (JP)

(72) Inventors: Hiroyuki Miyake, Kanagawa (JP); Tomoyuki Iwabuchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 101 days.

(21) Appl. No.: 14/136,649

(22) Filed: Dec. 20, 2013

(65) Prior Publication Data

US 2014/0103387 A1  Apr. 17, 2014

Related U.S. Application Data

(63) Continuation of application No. 13/278,856, filed on Oct. 21, 2011, now Pat. No. 8,614,699, which is a (Continued)

(30) Foreign Application Priority Data

Sep. 16, 2004   (JP) .................................. 2004-270447

(51) Int. Cl.
  *H01L 27/15*   (2006.01)
  *H05B 33/02*   (2006.01)
  (Continued)

(52) U.S. Cl.
  CPC ......... *H01L 27/156* (2013.01); *G09G 3/3233* (2013.01); *G09G 3/3241* (2013.01);
  (Continued)

(58) Field of Classification Search
  CPC ... G09G 2300/0842; G09G 2300/0852; G09G 2310/0256; G09G 2320/02;
  (Continued)

(56) References Cited

U.S. PATENT DOCUMENTS 4,725,558 A   2/1988   Yamazaki et al.
4,806,496 A   2/1989   Suzuki et al.
(Continued)

FOREIGN PATENT DOCUMENTS

CN   1345021 A   4/2002
CN   1417767 A   5/2003
(Continued)

OTHER PUBLICATIONS

Tsutsui, T. et al, "Electroluminescence in Organic Thin Films," Photochemical Processes in Organized Molecular Systems, 1991, Elsevier Science Publishers, Tokyo, pp. 437-450.
(Continued)

*Primary Examiner* — Ashok Patel
(74) *Attorney, Agent, or Firm* — Husch Blackwell LLP

(57) ABSTRACT

A problem in that a light emitting element slightly emits light is solved by an off current of a thin film transistor connected in series to the light emitting element, thereby a display device which can perform a clear display by increasing contrast, and a driving method thereof are provided. When the thin film transistor connected in series to the light emitting element is turned off, a charge held in the capacitance of the light emitting element itself is discharged. Even when an off current is generated at the thin film transistor connected in series to the light emitting element, this off current charges this capacitance until the capacitance of the light emitting element itself holds a predetermined voltage again. Accordingly, the off current of the thin film transistor does not contribute to light emission. In this manner, a slight light emission of the light emitting element can be reduced.

21 Claims, 15 Drawing Sheets

Related U.S. Application Data continuation of application No. 11/222,152, filed on Sep. 8, 2005, now Pat. No. 8,044,895.

(51) Int. Cl.
  *G09G 3/32* (2016.01)
  *H01L 27/32* (2006.01)

(52) U.S. Cl.
  CPC ............. *G09G 2300/0842* (2013.01); *G09G 2300/0852* (2013.01); *G09G 2310/0256* (2013.01); *G09G 2320/02* (2013.01); *G09G 2320/0238* (2013.01); *H01L 27/3244* (2013.01); *H01L 27/3248* (2013.01); *H01L 27/3265* (2013.01)

(58) Field of Classification Search
  CPC ......... G09G 2320/0238; G09G 3/3233; G09G 3/3241; H01L 27/156; H01L 27/3244; H01L 27/3248; H01L 27/3265
  See application file for complete search history.

(56) References Cited

U.S. PATENT DOCUMENTS

| | | | |
|---|---|---|---|
| 4,951,041 A | 8/1990 | Inada et al. | |
| 5,343,054 A | 8/1994 | Maroney, III et al. | |
| 5,414,443 A | 5/1995 | Kanatani et al. | |
| 5,552,678 A | 9/1996 | Tang et al. | |
| 5,641,991 A | 6/1997 | Sakoh | |
| 5,714,968 A | 2/1998 | Ikeda | |
| 5,793,163 A | 8/1998 | Okuda | |
| 5,882,761 A | 3/1999 | Kawami et al. | |
| 5,940,053 A | 8/1999 | Ikeda | |
| 5,990,629 A | 11/1999 | Yamada et al. | |
| 6,011,529 A | 1/2000 | Ikeda | |
| 6,084,579 A | 7/2000 | Hirano | |
| 6,087,245 A | 7/2000 | Yamazaki et al. | |
| 6,380,689 B1 | 4/2002 | Okuda | |
| 6,525,704 B1 | 2/2003 | Kondo et al. | |
| 6,583,581 B2 | 6/2003 | Kaneko et al. | |
| 6,618,029 B1 | 9/2003 | Ozawa | |
| 6,633,287 B1 | 10/2003 | Yatabe et al. | |
| 6,661,180 B2 | 12/2003 | Koyama | |
| 6,710,548 B2 | 3/2004 | Kimura | |
| 6,739,931 B2 | 5/2004 | Yamazaki et al. | |
| 6,750,833 B2 | 6/2004 | Kasai | |
| 6,765,560 B1 | 7/2004 | Ozawa | |
| 6,777,249 B2 | 8/2004 | Yamazaki | |
| 6,809,482 B2 | 10/2004 | Koyama | |
| 6,836,069 B2 | 12/2004 | Iga | |
| 6,858,991 B2 | 2/2005 | Miyazawa | |
| 6,873,116 B2 | 3/2005 | Kimura et al. | |
| 6,882,113 B2 | 4/2005 | Kaneko et al. | |
| 6,900,470 B2 | 5/2005 | Kobayashi et al. | |
| 6,921,918 B2* | 7/2005 | Park | H01L 27/3244 257/290 |
| 6,936,846 B2 | 8/2005 | Koyama et al. | |
| 6,943,766 B2 | 9/2005 | Nakamura et al. | |
| 6,995,511 B2 | 2/2006 | Yamazaki et al. | |
| 7,019,717 B2 | 3/2006 | Yumoto et al. | |
| 7,061,451 B2 | 6/2006 | Kimura | |
| 7,091,939 B2 | 8/2006 | Kasai | |
| 7,142,781 B2 | 11/2006 | Koyama et al. | |
| 7,157,847 B2 | 1/2007 | Kawachi et al. | |
| 7,193,668 B2* | 3/2007 | Kim | G02F 1/133514 257/59 |
| 7,196,360 B2 | 3/2007 | Seo et al. | |
| 7,224,115 B2 | 5/2007 | Sato et al. | |
| 7,282,736 B2 | 10/2007 | Murakami et al. | |
| 7,301,275 B2 | 11/2007 | Iga | |
| 7,330,168 B2 | 2/2008 | Anzai | |
| 7,362,298 B2 | 4/2008 | Wakabayashi | |
| 7,397,451 B2 | 7/2008 | Ozawa | |
| 7,417,608 B2 | 8/2008 | Kaneko et al. | |
| 7,427,970 B2 | 9/2008 | Iguchi | |
| 7,456,425 B2 | 11/2008 | Seo et al. | |
| 7,459,849 B2 | 12/2008 | Yamazaki et al. | |
| 7,460,094 B2 | 12/2008 | Ozawa | |
| 7,491,562 B2 | 2/2009 | Murakami et al. | |
| 7,514,868 B2 | 4/2009 | Yamazaki et al. | |
| 7,612,745 B2 | 11/2009 | Yumoto et al. | |
| 7,612,746 B2 | 11/2009 | Kimura | |
| 7,675,232 B2 | 3/2010 | Kawachi et al. | |
| 7,718,452 B2 | 5/2010 | Sato et al. | |
| 7,760,162 B2 | 7/2010 | Miyazawa | |
| 7,960,917 B2 | 6/2011 | Kimura | |
| 8,044,588 B2 | 10/2011 | Yamazaki et al. | |
| 8,310,475 B2 | 11/2012 | Ozawa | |
| 8,310,476 B2 | 11/2012 | Ozawa | |
| 8,334,858 B2 | 12/2012 | Ozawa | |
| 8,421,352 B2 | 4/2013 | Yamazaki et al. | |
| 8,513,648 B2 | 8/2013 | Seo et al. | |
| 8,618,732 B2 | 12/2013 | Yamazaki et al. | |
| 2002/0042152 A1 | 4/2002 | Yamazaki et al. | |
| 2002/0047839 A1 | 4/2002 | Kasai | |
| 2002/0050962 A1 | 5/2002 | Kasai | |
| 2002/0113241 A1* | 8/2002 | Kubota | H01L 51/5253 257/79 |
| 2002/0113760 A1 | 8/2002 | Kimura | |
| 2002/0181276 A1 | 12/2002 | Yamazaki | |
| 2003/0016190 A1 | 1/2003 | Kondo | |
| 2003/0095087 A1 | 5/2003 | Libsch et al. | |
| 2003/0103022 A1 | 6/2003 | Noguchi et al. | |
| 2003/0127650 A1* | 7/2003 | Park | H01L 27/3244 257/72 |
| 2003/0160745 A1 | 8/2003 | Osame et al. | |
| 2003/0214245 A1 | 11/2003 | Yamazaki et al. | |
| 2004/0018797 A1 | 1/2004 | Murakami et al. | |
| 2004/0100202 A1 | 5/2004 | Koyama | |
| 2004/0206974 A1 | 10/2004 | Yamazaki et al. | |
| 2005/0023969 A1 | 2/2005 | Omata et al. | |
| 2005/0062686 A1 | 3/2005 | Iguchi | |
| 2005/0231456 A1 | 10/2005 | Nakamura et al. | |
| 2009/0009440 A1 | 1/2009 | Kawachi et al. | |
| 2009/0160331 A1 | 6/2009 | Omata et al. | |
| 2014/0183576 A1 | 7/2014 | Yamazaki et al. | |
| 2015/0097178 A1 | 4/2015 | Yamazaki et al. | |

FOREIGN PATENT DOCUMENTS

| | | |
|---|---|---|
| EP | 0 704 912 A1 | 4/1996 |
| EP | 0 766 221 A1 | 4/1997 |
| EP | 0 776 147 A1 | 5/1997 |
| EP | 1 039 440 A1 | 9/2000 |
| EP | 1 103 946 A2 | 5/2001 |
| EP | 1 148 553 A2 | 10/2001 |
| EP | 1 191 512 A2 | 3/2002 |
| EP | 1 231 592 A2 | 8/2002 |
| EP | 1 291 841 A2 | 3/2003 |
| EP | 1 353 316 A1 | 10/2003 |
| EP | 1 622 121 A2 | 2/2006 |
| EP | 2 282 306 A1 | 2/2011 |
| JP | 1-31197 | 2/1989 |
| JP | 8-54836 | 2/1996 |
| JP | 8-78519 | 3/1996 |
| JP | 8-180972 | 7/1996 |
| JP | 9-97925 | 4/1997 |
| JP | 9-148066 | 6/1997 |
| JP | 10-41068 | 2/1998 |
| JP | 10-214042 A | 8/1998 |
| JP | 10-214060 | 8/1998 |
| JP | 10-232649 | 9/1998 |
| JP | 10-312173 | 11/1998 |
| JP | 2000-122608 | 4/2000 |
| JP | 2000-276109 | 10/2000 |
| JP | 2000-347621 | 12/2000 |
| JP | 2001-109432 | 4/2001 |
| JP | 2001-142413 | 5/2001 |
| JP | 2001-222255 | 8/2001 |
| JP | 2001-343933 | 12/2001 |
| JP | 2002-164181 A | 6/2002 |
| JP | 2002-190390 | 7/2002 |
| JP | 2002-196706 | 7/2002 |

(56) References Cited

FOREIGN PATENT DOCUMENTS

| | | |
|---|---|---|
| JP | 2002-207451 | 7/2002 |
| JP | 2002-311898 | 10/2002 |
| JP | 2002-318556 A | 10/2002 |
| JP | 2002-323873 A | 11/2002 |
| JP | 2002-366057 A | 12/2002 |
| JP | 2003-150109 | 5/2003 |
| JP | 2003-168570 A | 6/2003 |
| JP | 2003-208127 | 7/2003 |
| JP | 2003-233332 A | 8/2003 |
| JP | 2003-255895 | 9/2003 |
| JP | 2003-271075 | 9/2003 |
| JP | 2003-323133 A | 11/2003 |
| JP | 2004-054188 A | 2/2004 |
| JP | 2004-207217 | 7/2004 |
| JP | 2004-309844 | 11/2004 |
| JP | 2005-84119 | 3/2005 |
| JP | 2006-58751 | 3/2006 |
| JP | 2006-231911 | 9/2006 |
| TW | 493282 B | 7/2002 |
| TW | 531718 B | 5/2003 |
| TW | 556022 B | 10/2003 |
| TW | 200306763 | 11/2003 |
| TW | 200412823 | 7/2004 |
| TW | 200414806 | 8/2004 |
| WO | WO 98/33165 A1 | 7/1998 |

OTHER PUBLICATIONS

Van Slyke, S.A. et al, "Organic Electroluminescent Devices with Improved Stability," Appl. Phys. Lett., vol. 69, No. 15, Oct. 7, 1996, pp. 2160-2162.

Baldo, M.A. et al, "Highly Efficient Phosphorescent Emission from Organic Electroluminescent Devices," Nature, vol. 395, Sep. 10, 1998, pp. 151-154.

Zou, D. et al, "Improvement of Current-Voltage Characteristics in Organic Light Emitting Diodes by Application of Reversed-Bias Voltage," Japanese Journal of Applied Physics, vol. 37, part 2, No. 11B, Nov. 15, 1998, pp. L-1406-L-1408.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, Dec. 15, 1999, pp. L1502-L1504.

Office Action re Chinese application No. CN 200510103877.4, dated Feb. 15, 2008 (with English translation).

Office Action re Taiwanese application No. TW 094129527, dated Sep. 18, 2012 (with English translation).

Taiwan Office Action re Application No. TW 103135043, dated Jan. 26, 2016.

\* cited by examiner

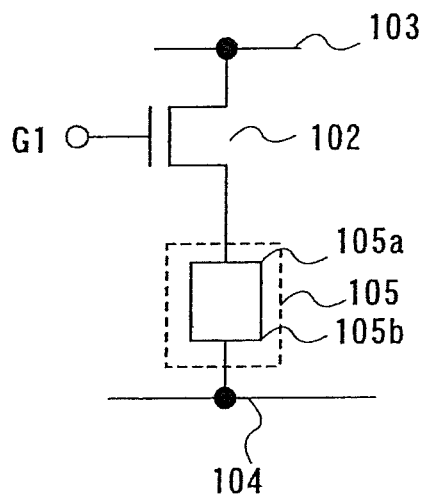
FIG. 8A
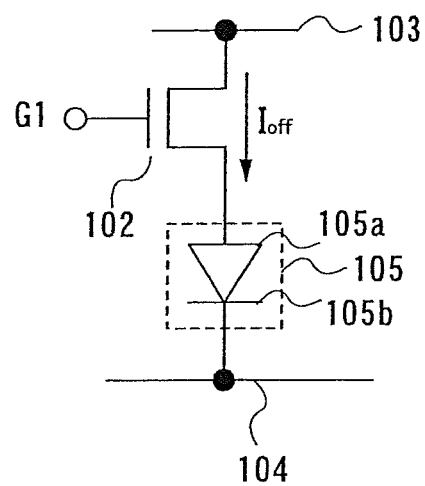
FIG. 8B
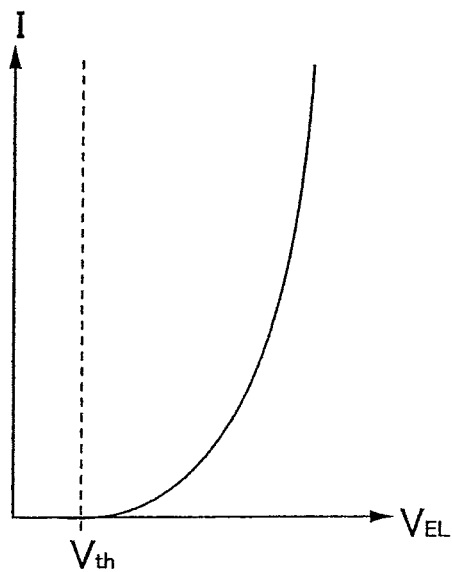
FIG. 8C
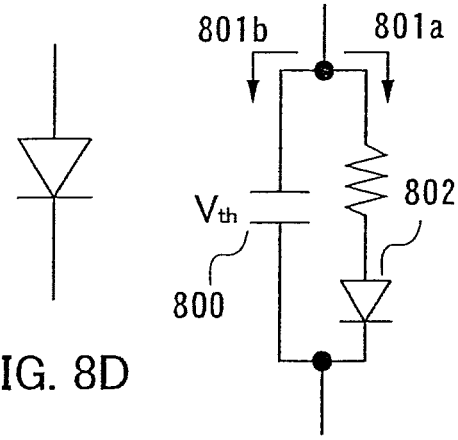
FIG. 8D
FIG. 8E

DISPLAY DEVICE AND DRIVING METHOD OF THE SAME

This application is a continuation of U.S. application Ser. No. 13/278,856 filed on Oct. 21, 2011 which is a continuation of U.S. application Ser. No. 11/222,152 filed on Sep. 8, 2005 (now U.S. Pat. No. 8,044,895 issued Oct. 25, 2011), all of which are incorporated herein by reference.

BACKGROUND OF THE INVENTION

1. Field of the Invention

The present invention relates to a display device of an active matrix driving method in which a switching element is provided in each pixel, and a driving method thereof. In particular, the invention relates to a display device in which a luminance of a light emitting element is controlled by controlling a current supplied to the light emitting element by using a switching element connected in series to the light emitting element, and a driving method thereof. More particularly, the invention relates to a display device including an element with diode characteristics as a light emitting element and a driving method thereof.

2. Description of the Related Art

A display device including a thin film transistor as a switching element and a driving method thereof are suggested. FIG. 8A shows an example of a pixel configuration thereof.

In FIG. 8A, reference numeral 105 denotes a light emitting element, 102 denotes a thin film transistor, 103 denotes a first power source line, and 104 denotes a second power source line. The light emitting element 105 includes two electrodes and emits light at a luminance according to a supplied current value of a current flowing between two electrodes. One of the two electrodes of the light emitting element 105 is referred to as a first electrode 105a while the other is referred to as a second electrode 105b. In the pixel shown in FIG. 8A, a value of a current (hereinafter referred to as a drain current) flowing between a source and drain of the thin film transistor 102 is controlled according to a potential G1 applied to a gate of the thin film transistor 102. The drain current of the thin film transistor 102 flows between the first electrode 105a and the second electrode 105b of the light emitting element 105 connected in series to the thin film transistor 102. The light emitting element emits light at a luminance according to a supplied current. In this manner, by controlling the drain current of the thin film transistor 102, the luminance of the light emitting element 105 is controlled to perform a display.

An electroluminescence element and the like can be used as the light emitting element 105. An electroluminescence element has diode characteristics to flow a current in only one direction. FIG. 8B shows the light emitting element 105 in FIG. 8A as a diode. In FIG. 8B, the first electrode 105a is an anode and the second electrode 105b is a cathode.

A display device in which a reverse bias voltage is regularly applied to the light emitting element 105 as well as a forward bias voltage is applied to the light emitting element 105 to emit light, and a driving method thereof have been suggested (see Patent Document 1).

[Patent Document 1]
Japanese Patent Laid-Open No. 2002490390

SUMMARY OF THE INVENTION

Hereinafter considered is the case where the light emitting element 105 emits no light so as to display "black" in FIG. 8B. A potential G1 is set appropriately to set a potential difference between the source and gate of the thin film transistor 102 to be equal to or lower than a threshold voltage of the thin film transistor 102 or lower, thereby the thin film transistor 102 is turned off. In this manner, the drain current of the thin film transistor 102 becomes zero so that the light emitting element 105 emits no light to display "black". It is preferable that the thin film transistor 102 be completely turned off when a voltage equal to or lower than the threshold voltage is applied to the source and gate, however, the thin film transistor 102 is not completely turned off in actuality and a slight amount of drain current flows. This current is denoted as $I_{off}$ in the drawing and referred to as an off current. Due to the off current $I_{off}$, the light emitting element which is not supposed to emit light emits light (hereinafter this phenomenon is referred to as grayish black effect). Accordingly, there is a problem in that contrast of a display is decreased.

In particular, in the case where the light emitting element 105 continues to operate with a forward bias voltage, that is the case where the light emitting element 105 continues to operate with a potential of the first electrode 105a (anode) being higher than that of the second electrode 105b (cathode), such a problem is found that a grayish black effect becomes remarkable.

It is found out that the grayish black effect becomes remarkable in the case where the light emitting element 105 continues to operate with a forward bias voltage because a voltage approximately the same as the threshold voltage of the light emitting element 105 is constantly held between the first electrode 105a and the second electrode 105b.

The threshold voltage of the light emitting element is $V_{th}$ in FIG. 8C. FIG. 8C shows a relationship of a current I flowing from the anode to cathode relatively to a potential difference $V_{EL}$ between a potential at the second electrode 105b (cathode) and a potential at the first electrode 105a (anode). When $V_{EL}$ becomes higher than the threshold voltage $V_{th}$, the current I flows. That is, a current flows in the light emitting element 105 when a voltage higher than the threshold voltage $V_{th}$ is applied between the first electrode 105a (anode) and the second electrode 105b (cathode), thereby the light emitting element 105 emits light.

A voltage approximately the same as the threshold voltage $V_{th}$ is held between the first electrode 105a (anode) and the second electrode 105b (cathode) of the light emitting element 105 because of capacitance of the light emitting element 105 itself. FIG. 8D shows a light emitting element shown as a diode and FIG. 8E shows an equivalent circuit diagram of FIG. 8D. A capacitor 800 in the equivalent circuit corresponds to capacitance of the light emitting element 105 itself. The threshold voltage $V_{th}$ is held by the capacitor 800.

In the case where the light emitting element 105 continues to operate with a forward bias voltage, a potential of the first electrode 105a (anode) continues to be higher than that of the second electrode 105b (cathode) even after the thin film transistor 102 is turned off, thereby a voltage approximately the same as the threshold voltage $V_{th}$ is held in the capacitor 800 of the light emitting element 105. Therefore, when an off current $I_{off}$ is generated in the thin film transistor 102, the off current $I_{off}$ flows to a path 801a on a diode 802 side without flowing to a path 801b on the capacitor 800 side in the equivalent circuit of FIG. 8E, thereby contributing to light emission. In this manner, the inventors found out that the grayish black effect becomes remarkable in the case where the light emitting element 105 continues to operate with a forward bias voltage.

The invention provides a display device which can perform a clear display by reducing grayish black effect and increasing contrast, and a driving method thereof.

In order to reduce the grayish black effect, the display device and driving method of the invention employ a following first configuration or second configuration.

[First Configuration]

In the case where a first electrode of a light emitting element is an anode and a second electrode thereof is a cathode, a potential of a second power source line is set so that a potential of the first electrode becomes equal to or higher than that of the second electrode and that a voltage applied between the first electrode and the second electrode becomes smaller than a threshold voltage of the light emitting element when a first thin film transistor connected in series to the light emitting element is selected to be turned off.

In the case where a first electrode of a light emitting element is a cathode and a second electrode thereof is an anode, a potential of a second power source line is set so that a potential of the first electrode becomes equal to or lower than that of the second electrode and that a voltage applied between the first electrode and the second electrode becomes smaller than a threshold voltage of the light emitting element when a first thin film transistor connected in series to the light emitting element is selected to be turned off.

[Second Configuration]

In the case where a first electrode of a light emitting element is an anode and a second electrode thereof is a cathode, a second thin film transistor is provided which is different than a first thin film transistor connected in series to the light emitting element. One of a source and drain of the second thin film transistor is connected to the first electrode of the light emitting element and the other is connected to a power source line. When the first thin film transistor is selected to be turned off, the second thin film transistor is selected to be turned on and a potential of the power source line is set equal to or higher than a potential of the second electrode of the light emitting element and lower than a potential obtained by adding the potential of the second electrode to a threshold voltage of the light emitting element.

In the case where the first electrode of the light emitting element is a cathode and the second electrode thereof is an anode, a second thin film transistor is provided which is different than the first thin film transistor connected in series to the light emitting element. One of a source and drain of the second thin film transistor is connected to the first electrode of the light emitting element and the other is connected to the power source line. When the first thin film transistor is selected to be turned off, the second thin film transistor is selected to be turned on and a potential of the power source line is set equal to or lower than a potential of the second electrode of the light emitting element and higher than a potential obtained by subtracting a threshold voltage of the light emitting element from the potential of the second electrode.

It is to be noted that the power source line connected to the second thin film transistor can be shared as a power source line connected to the second electrode of the light emitting element.

According to the first and second configuration, a thin film transistor having an active layer formed of a polycrystalline semiconductor can be used as the first thin film transistor.

According to the first and second configuration, a third configuration described next can be used in combination.

[Third Configuration]

A capacitor is provided to be connected in parallel to a light emitting element.

That is, the capacitor is provided so that one electrode is connected to a first electrode of the light emitting element and the other electrode is connected to a second electrode of the light emitting element.

According to a display device and a driving method thereof of the invention, when a thin film transistor connected in series to a light emitting element is selected to be turned off so that a light emitting element emits no light, a charge corresponding to a threshold voltage held in the capacitance of the light emitting element itself can be discharged. Accordingly, when an off current is generated in the thin film transistor connected in series to the light emitting element, the off current flows to charge the capacitance of the light emitting element itself until the capacitance of the light emitting element itself holds a threshold voltage again. Therefore, the off current of the thin film transistor does not contribute to light emission for a while after the thin film transistor connected in series to the light emitting element is selected to be turned off. In this manner, a grayish black effect can be reduced. Accordingly, according to the display device and the driving method thereof of the invention, a clear display can be performed by increasing the contrast of the display.

According to the first and second configurations, when the thin film transistor connected in series to the light emitting element is selected to be turned off so that the light emitting element emits no light, a forward bias voltage is applied between the electrodes of the light emitting element and the voltage is set lower than the threshold voltage of the light emitting element. According to both of the first and second configurations, a reverse bias voltage is not applied to the light emitting element. Accordingly, compared to a method for regularly applying a reverse bias voltage to the light emitting element, power consumption can be reduced according to the display device and the driving method thereof of the invention.

According to the second configuration, the power source line connected to the second thin film transistor is shared as a power source line connected to the second electrode of the light emitting element, thereby the number of wiring lines can be reduced and an aperture ratio of pixel can be improved.

Compared to a thin film transistor having an active layer formed of a single crystalline semiconductor or an amorphous semiconductor, a thin film transistor having an active layer formed of a polycrystalline semiconductor produces more off current due to a crystal grain boundary and the like. Therefore, the invention is efficient particularly in the case of using a thin film transistor having an active layer formed of a polycrystalline semiconductor as a first thin film transistor.

By using the first and second configurations in combination, an off current of the thin film transistor connected in series to the light emitting element continues to flow to the capacitor until it is charged. Therefore, longer time can be taken after selecting to turn off the thin film transistor connected in series to the light emitting element until the off current of the thin film transistor starts to contribute to the light emission. In this manner, a grayish black effect can further be reduced.

As described above, the invention provides a display device which can perform a clear display with a higher contrast and less power consumption, and a driving method thereof.

BRIEF DESCRIPTION OF THE DRAWINGS

FIGS. 8A and 8B show conventional configurations and FIGS. 8C to 8E show configurations of a light emitting element.

DETAILED DESCRIPTION OF THE INVENTION

Figure 1A:
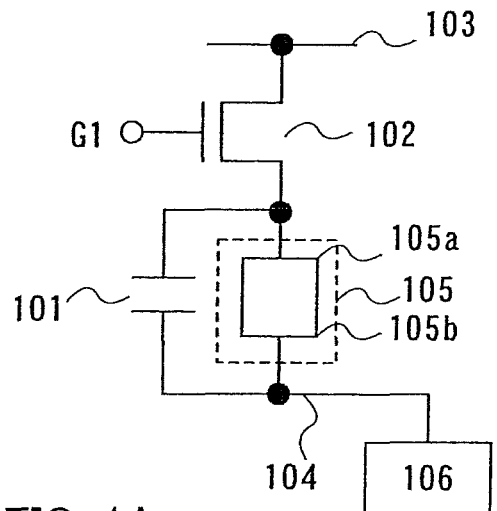
FIGS. 1A to 1C are diagrams showing Embodiment Mode 1 of the invention.

Although the present invention will be fully described by way of Embodiment Modes and Embodiments with reference to the accompanying drawings, it is to be understood that various changes and modifications will be apparent to those skilled in the art. Therefore, unless otherwise such changes and modifications depart from the scope of the invention, they should be construed as being included therein. Note that identical portions in embodiment modes and embodiments are denoted by the same reference numerals and detailed descriptions thereof are omitted.

[Embodiment Mode 1]

Figures 1B, 1C:
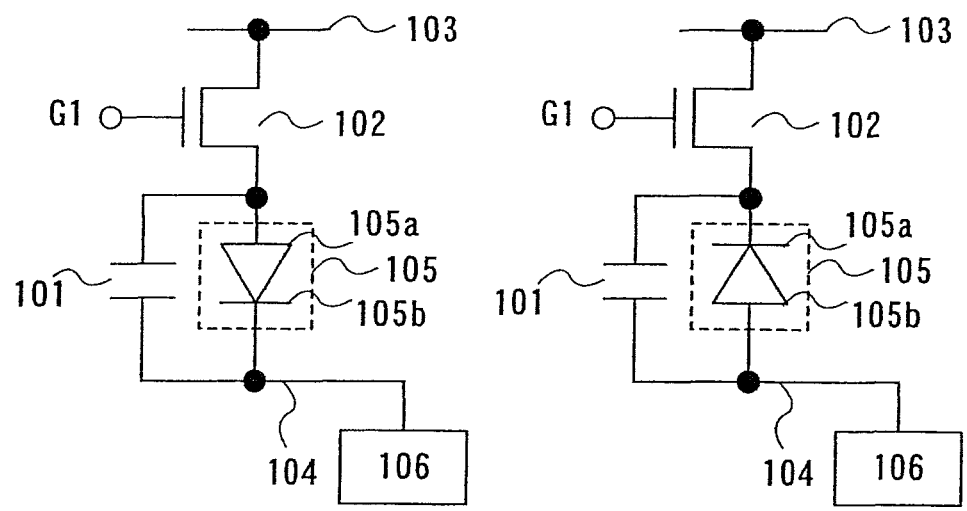

An example in which the first and third configurations are used in combination is described with reference to FIGS. 1A to 1C. In FIGS. 1A to 1C, reference numeral 105 denotes a light emitting element, 102 denotes a thin film transistor, 103 denotes a first power source line, 104 denotes a second power source line, 101 denotes a capacitor, and 106 denotes a circuit for setting a potential. The circuit 106 for setting a potential corresponds to the first configuration. The capacitor 101 corresponds to the third configuration. The light emitting element 105 has two electrodes and emits light at a luminance according to a current value of a current flowing between the two electrodes. One of the two electrodes of the light emitting element 105 is referred to as a first electrode 105a while the other is referred to as a second electrode 105b.

A method for using the first and third configurations in combination is described with reference to FIG. 1A.

When the thin film transistor 102 connected in series to the light emitting element 105 is selected to be turned off, the circuit 106 for setting a potential changes a potential of the second power source line 104 so that a forward bias voltage is applied between electrodes of the light emitting element 105 and the voltage becomes lower than the threshold voltage of the light emitting element 105. In this manner, a charge held in the capacitance of the light emitting element 105 itself is discharged to reduce slight light emission of the light emitting element 105.

When the thin film transistor 102 connected in series to the light emitting element 105 is selected to be turned on, the circuit 106 for setting a potential changes a potential of the second power source line 104 so that a forward bias voltage is applied between electrodes of the light emitting element 105 and the voltage becomes higher than the threshold voltage of the light emitting element 105. A drain current of the thin film transistor 102 which flows according to a potential G1 applied to a gate thereof flows to the light emitting element 105. The light emitting element 105 emits light at a luminance according to the drain current. In this manner, the luminance of the light emitting element 105 is controlled to perform a display.

The circuit 106 for setting a potential can have, for example, a configuration including a switch and two terminals (referred to as a first terminal and a second terminal) which are applied different potentials. The switch selects a connection between the first terminal and the second power source line 104 or a connection between the second terminal and the second power source line 104. When the thin film transistor 102 is selected to be turned off, the switch connects the first terminal and the second power source line 104 while the switch connects the second terminal and the second power source line 104 when the thin film transistor 102 is selected to be turned on. The first terminal is applied such a voltage as to apply a forward bias voltage between the electrodes of the light emitting element 105 in relation to a potential applied to the first power source line 103 and set the applied voltage lower than the threshold voltage of the light emitting element 105. The second terminal is applied such a voltage as to apply a forward bias voltage between the electrodes of the light emitting element 105 in relation to a potential applied to the first power source line 103 and set the applied voltage higher than the threshold voltage of the light emitting element 105.

A gray scale can be displayed by controlling the time in which the light emitting element 105 emits light in one frame period.

One electrode of the capacitor 101 is connected to the first electrode 105a while the other electrode is connected to the second electrode 105b. That is, the capacitor 101 is connected in parallel to the light emitting element 105. An off current of the thin film transistor 102 connected in series to the light emitting element 105 flows to the capacitor 101 provided additionally until it is charged. Therefore, longer time can be taken after turning off the thin film transistor 102 connected in series to the light emitting element 105 until the off current of the thin film transistor 102 starts to contribute to the light emission. In this manner, a grayish black effect can further be reduced.

An electroluminescence element and the like can be used as the light emitting element 105. The electroluminescence element has diode characteristics to flow a current in only one direction. Each of FIGS. 1B and 1C shows the light emitting element 105 in FIG. 1A as a diode. In FIG. 1B, the first electrode 105a is an anode and the second electrode 105b is a cathode. In FIG. 1C, the first electrode 105a is a cathode and the second electrode 105b is an anode.

The circuit 106 for setting a potential in FIG. 1B is described.

When the thin film transistor 102 is selected to be turned on, a potential of the second power source line 104 is set so that a potential of the first electrode 105a becomes higher than that of the second electrode 105b and a voltage applied between the first electrode 105a and the second electrode 105b becomes higher than the threshold voltage of the light emitting element 105, thereby the light emitting element 105 emits light.

When the thin film transistor 102 is selected to be turned off, a potential of the second power source line 104 is set so that a potential of the first electrode 105a becomes equal to or higher than that of the second electrode 105b and a voltage applied between the first electrode 105a and the second electrode 105b becomes lower than the threshold voltage of the light emitting element 105, thereby the light emitting element 105 emits no light.

The circuit 106 for setting a potential in FIG. 1C is described.

When the thin film transistor 102 is selected to be turned on, a potential of the second power source line 104 is set so that a potential of the first electrode 105a becomes lower than that of the second electrode 105b and a voltage applied between the first electrode 105a and the second electrode 105b becomes higher than the threshold voltage of the light emitting element 105, thereby the light emitting element 105 emits light.

When the thin film transistor 102 is selected to be turned off, a potential of the second power source line 104 is set so that a potential of the first electrode 105a becomes equal to or lower than that of the second electrode 105b and a voltage applied between the first electrode 105a and the second electrode 105b is lower than the threshold voltage of the light emitting element 105, thereby the light emitting element 105 emits no light.

[Embodiment Mode 2]

Figure 2A:
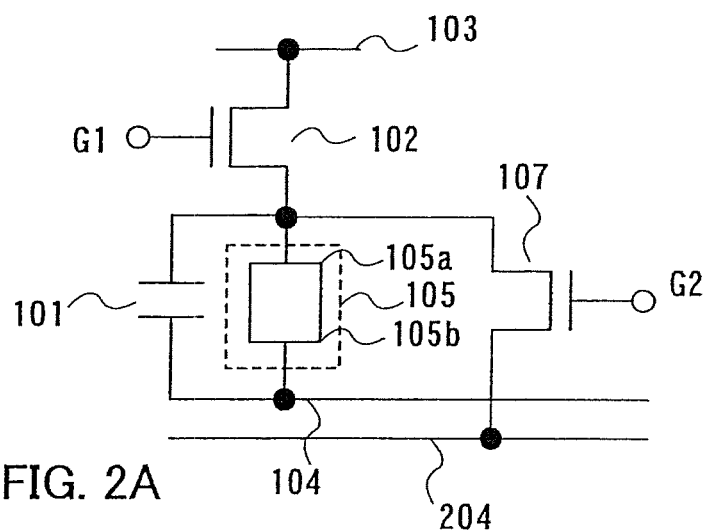
FIGS. 2A to 2C are diagrams showing Embodiment Mode 2 of the invention.
Figures 2B, 2C:
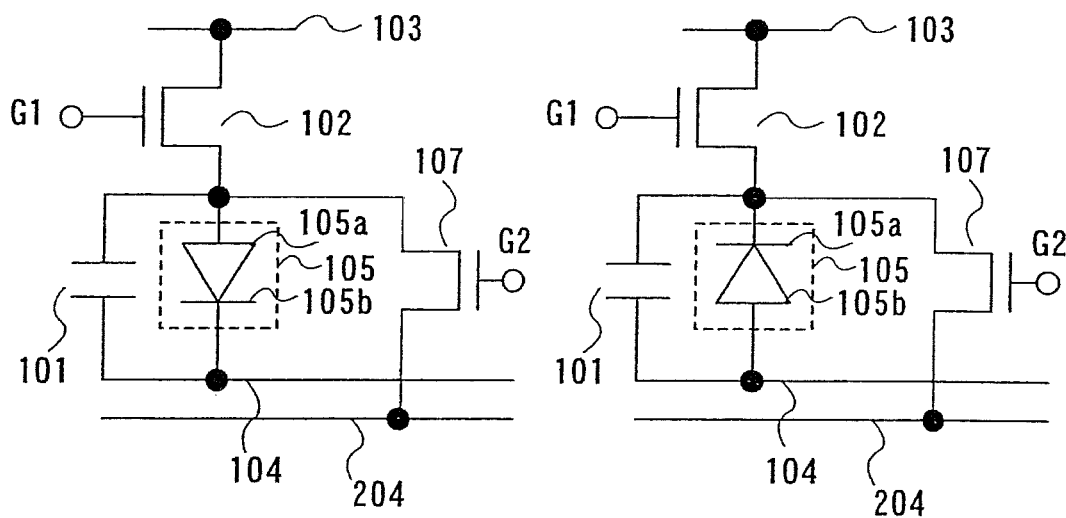

An example of using the second and third configurations in combination is described with reference to FIGS. 2A to 2C. In FIGS. 2A to 2C, the same reference numerals are used for the same portions as in FIGS. 1A to 1C, and a description thereon is omitted. Reference numeral 107 denotes a thin film transistor. The thin film transistor 107 and a third power source line 204 correspond to the second configuration. The capacitor 101 corresponds to the third configuration.

A method for using the second and third configurations in combination is described in details with reference to FIG. 2A.

When the thin film transistor 102 connected in series to the light emitting element 105 is selected to be turned off, the thin film transistor 107 is selected to be turned on by controlling a potential G2 applied to a gate thereof. In this manner, a potential of the third power source line 204 is applied to the first electrode 105a. When the thin film transistor 107 is selected to be turned on, a potential difference between the second power source line 104 and the third power source line 204 is set zero or higher and lower than the threshold voltage of the light emitting element 105. In this manner, a charge held in the capacitance of the light emitting element 105 itself is discharged to reduce slight light emission of the light emitting element 105.

The second power source line 104 and the third power source line 204 can be shared as well. In this manner, an aperture ratio of pixel can be improved by reducing the number of wirings.

The thin film transistor 107 is selected to be turned off by controlling the potential G2 applied to a gate when the thin film transistor 102 connected in series to the light emitting element 105 is selected to be turned on. A drain current of the thin film transistor 102 which flows according to the potential G1 applied to the gate thereof flows to the light emitting element 105. The light emitting element 105 emits light at a luminance according to the drain current. In this manner, the luminance of the light emitting element 105 is controlled to perform a display.

A gray scale can be displayed by controlling the time in which the light emitting element 105 emits light in one frame period.

By providing the capacitor 101, longer time can be taken after selecting to turn off the thin film transistor 102 connected in series to the light emitting element 105 until the off current of the thin film transistor 102 starts to contribute to the light emission. In this manner, a grayish black effect can further be reduced.

An electroluminescence element and the like can be used as the light emitting element 105. The electroluminescence element has diode characteristics to flow a current in only one direction. Each of FIGS. 2B and 2C shows the light emitting element 105 in FIG. 2A as a diode. In FIG. 2B, the first electrode 105a is an anode and the second electrode 105b is a cathode. In FIG. 2C, the first electrode 105a is a cathode and the second electrode 105b is an anode.

[Embodiment Mode 3]

An example of using the first and third configurations in combination is described with reference to FIGS. 3A to 3D. In FIGS. 3A to 3D, the same reference numerals are used for the same portions as in FIGS. 1A to 1C and a description thereon is omitted.

Figure 3A:
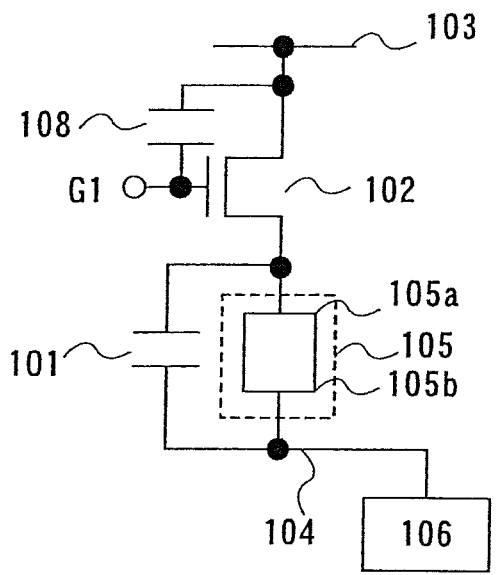
FIGS. 3A to 3D are diagrams showing Embodiment Mode 3 of the invention.
Figure 3B:
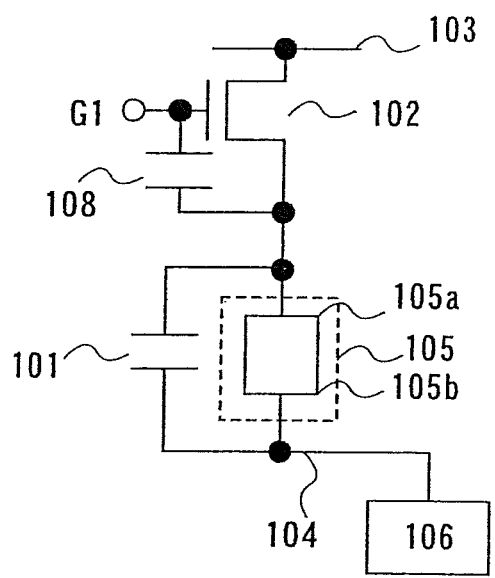

Each of FIGS. 3A and 3B corresponds to FIG. 1A provided with the capacitor 108. The capacitor 108 is provided to hold a gate-source voltage of the thin film transistor 102. FIG. 3A shows an example where the thin film transistor 102 has a source on a side connected to the first power source line 103. FIG. 3B shows an example where the thin film transistor 102 has a source on a side connected to the first electrode 105a of the light emitting element 105.

A drain current of the thin film transistor 102 changes according to a potential difference between a source potential thereof and the gate potential G1. Even if the gate potential G1 of the thin film transistor 102 is controlled, when a source potential changes, a potential difference between the source potential and the gate potential changes, which changes the drain current. Accordingly, it is preferable to keep the source potential of the thin film transistor 102 constant. Therefore, it is preferable that the thin film transistor 102 have a source on a side connected to the first power source line 103 as shown in FIG. 3A.

Figure 3C:
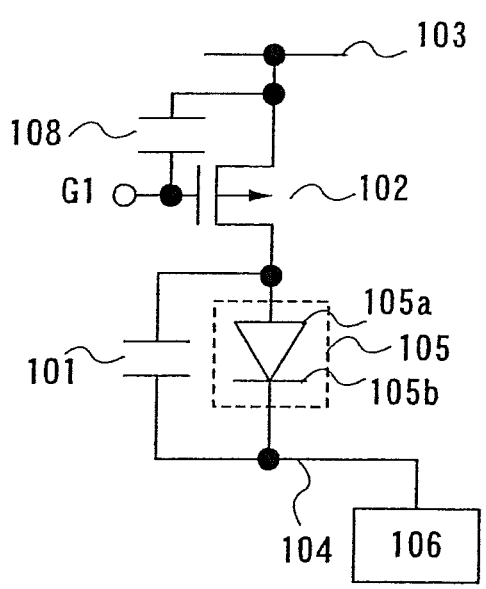
Figure 3D:
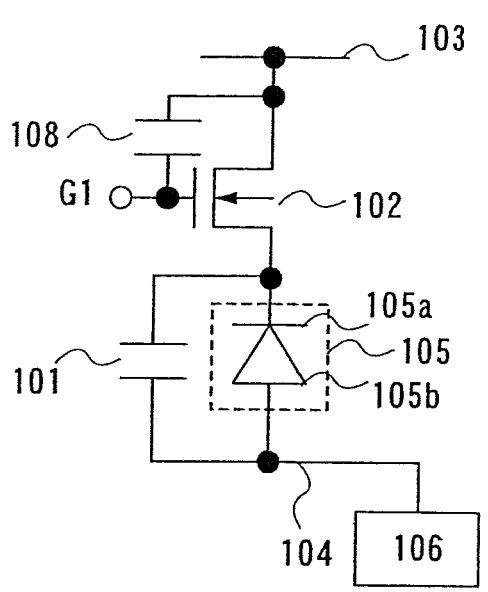

Each of FIGS. 3C and 3D corresponds to FIG. 3A in which the light emitting element 105 is shown as a diode. The first electrode 105a is an anode and the second electrode 105b is a cathode in FIG. 3C. The first electrode 105a is a cathode and the second electrode 105b is an anode in FIG. 3D.

In FIG. 3C, a current flows from the first power source line 103 in a direction to the second power source line 104, thereby the light emitting element 105 emits light. A potential of the thin film transistor 102 on a side connected to the first power source line 103 becomes higher than that on a side connected to the first electrode 105a of the light emitting element 105. A p-channel transistor is used as the thin film transistor 102 so that the thin film transistor 102 has a source on the side connected to the first power source line 103.

In FIG. 3D, a current flows from the second power source line 104 in a direction to the first power source line 103, thereby the light emitting element 105 emits light. A potential of the thin film transistor 102 on the side connected to the first electrode 105a of the light emitting element 105 becomes higher than that on the side connected to the first power source line 103. An n-channel transistor is used as the thin film transistor 102 so that the thin film transistor 102 has a source on the side connected to the first power source line 103.

[Embodiment Mode 4]

An example of using the second and third configurations in combination is described with reference to FIGS. 4A to 4D. In FIGS. 4A to 4D, the same reference numerals are used for the same portions as in FIGS. 2A to 3D.

Figure 4A:
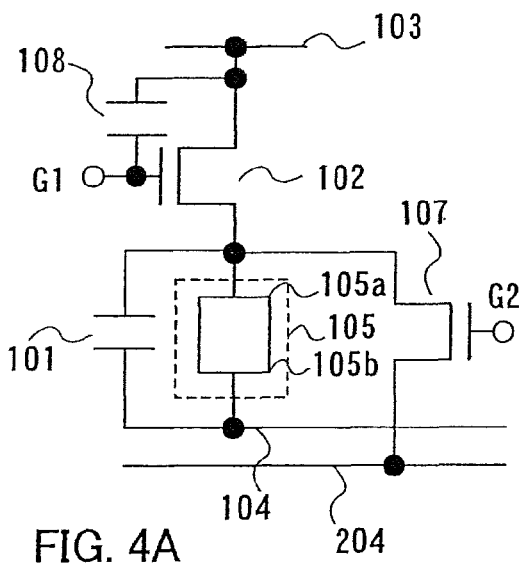
FIGS. 4 A to 4D are diagrams showing Embodiment Mode 4 of the invention.
Figure 4B:
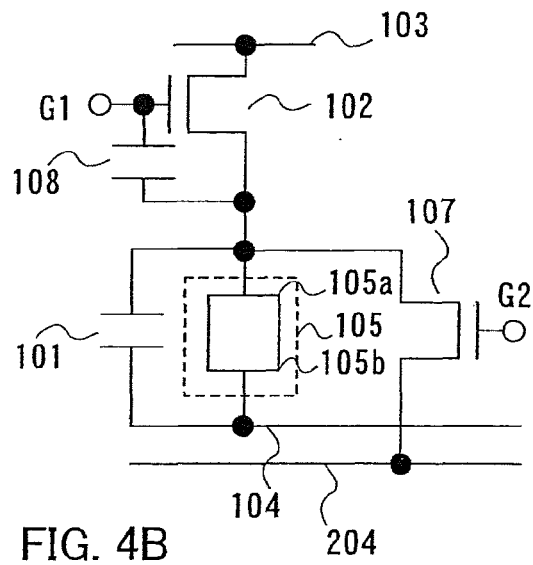

Each of FIGS. 4A and 4B corresponds to FIG. 2A provided with the capacitor 108. The capacitor 108 is provided to hold a gate-source voltage of the thin film transistor 102. FIG. 4A shows an example where the thin film transistor 102 has a source on a side connected to the first power source line 103. FIG. 4B shows an example where the thin film transistor 102 has a source on a side connected to the first electrode 105a of the light emitting element 105.

FIG. 4A is preferable in that the thin film transistor 102 has a source on the side connected to the first power source line 103 similarly to FIG. 3A.

Figure 4C:
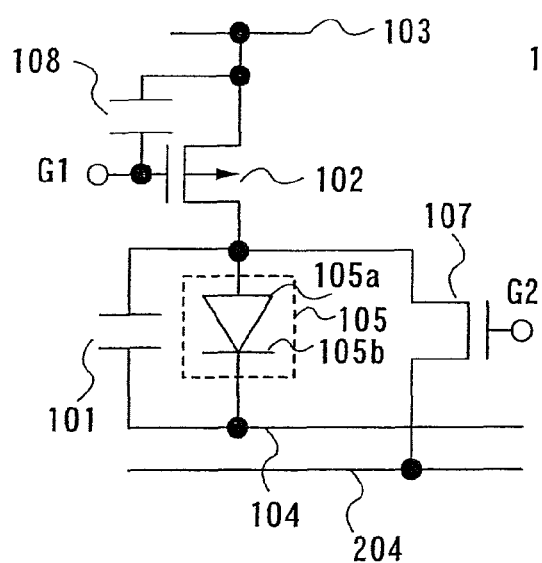
Figure 4D:
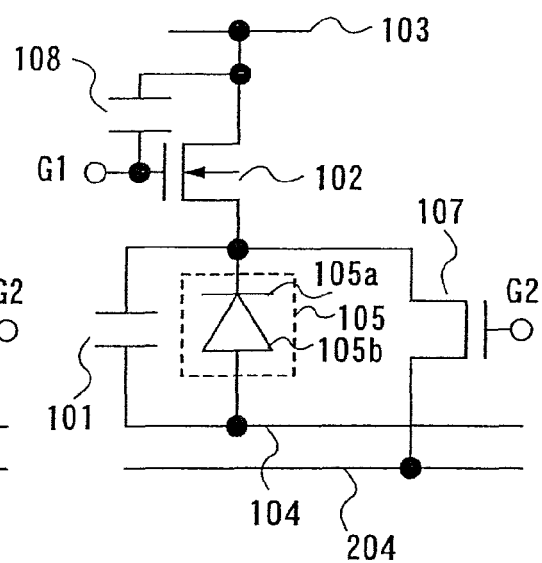

Each of FIGS. 4C and 4D corresponds to FIG. 4A in which the light emitting element 105 is shown as a diode. The first electrode 105a is an anode and the second electrode 105 is a cathode in FIG. 4C. The first electrode 105a is a cathode and the second electrode 105b is an anode in FIG. 4D.

In FIG. 4C, a p-channel transistor is used as the thin film transistor 102 so that the thin film transistor 102 has a source on the side connected to the first power source line 103. In FIG. 4D, an n-channel transistor is used as the thin film transistor 102 so that the thin film transistor 102 has a source on the side connected to the first power source line 103.

[Embodiment 1]

A specific example of a pixel using a configuration described in embodiment modes is described with reference to FIGS. 5A to 5D. In FIGS. 5A to 5D, the same reference numerals are used for the same portions as in FIGS. 1A to 4D, and a description thereon is omitted.

Figure 5A:
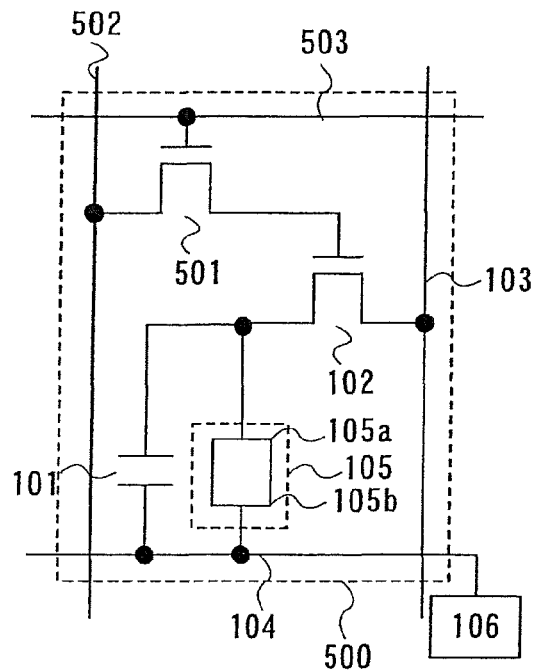
FIGS. 5A to 5D are diagrams showing Embodiment 1 of the invention.
Figure 5B:
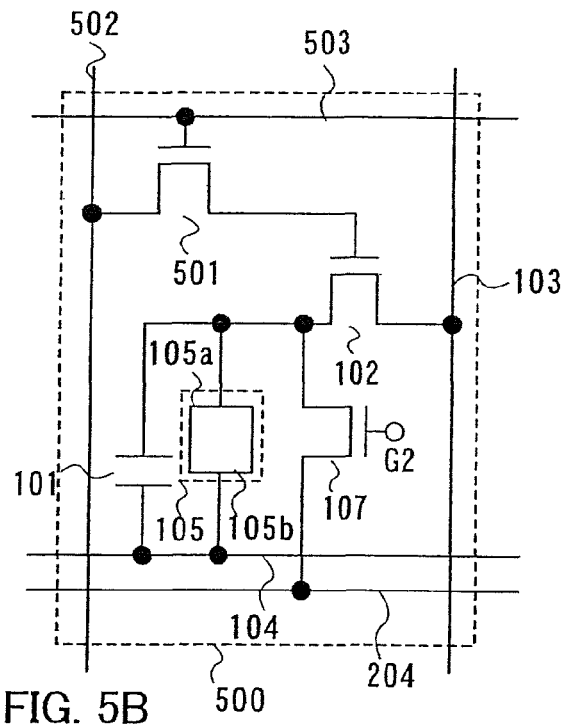
Figure 5C:
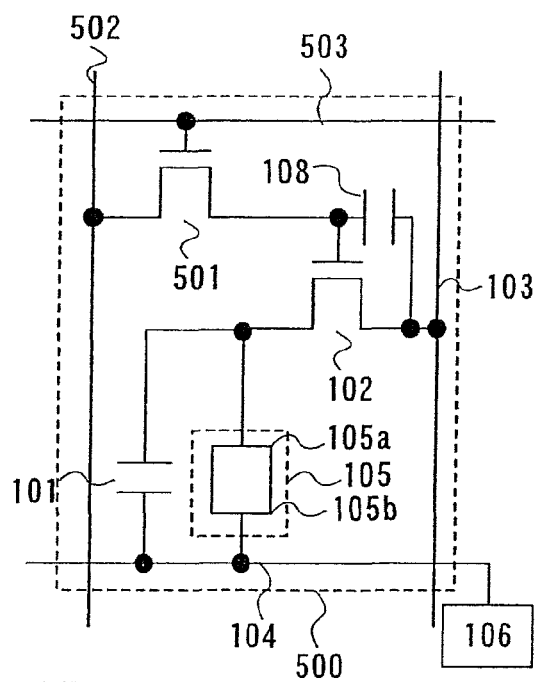
Figure 5D:
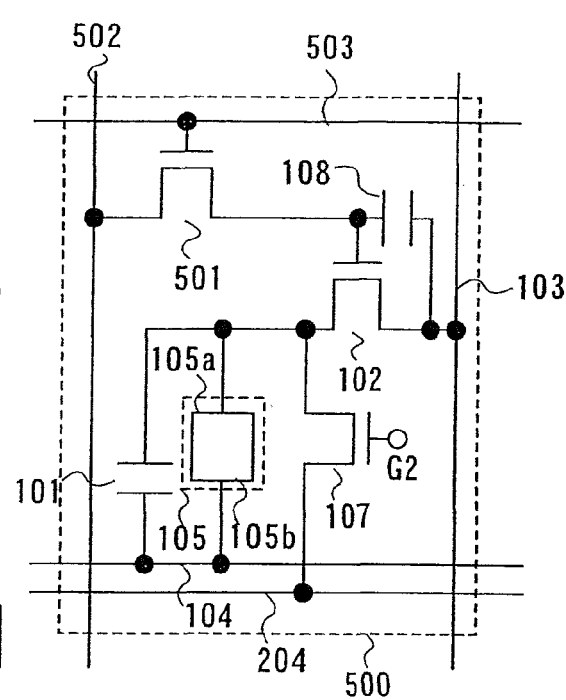

FIG. 5A shows the configuration of FIG. 1A showing a specific example of a circuit for inputting the potential G1 to the gate of the thin film transistor 102. FIG. 5B shows the configuration of FIG. 2A showing a specific example of a circuit for inputting the potential G1 to the gate of the thin film transistor 102. FIG. 5C shows the configuration of FIG. 3A showing a specific example of a circuit for inputting the potential G1 to the gate of the thin film transistor 102. FIG. 5D shows the configuration of FIG. 4A showing a specific example of a circuit for inputting the potential G1 to the gate of the thin film transistor 102.

In FIGS. 5A to 5D, reference numeral 500 denotes a pixel, 501 denotes a thin film transistor, 502 denotes a signal line, and 503 denotes a scan line. One of a source and drain of the thin film transistor 501 is connected to the signal line 502 while the other is connected to the gate of the thin film transistor 102. A gate of the thin film transistor 501 is connected to the scan line 503.

In the configurations shown in FIGS. 5A to 5D, when the thin film transistor 501 is selected to be turned on by a signal inputted to the scan line 503, a signal inputted to the signal line 502 is inputted to the gate of the thin film transistor 102. In this manner, on/off of the thin film transistor 102 and a value of a drain current thereof when turned on are controlled.

In FIG. 5A, an operation of the circuit 106 for setting a potential in each of the case where the thin film transistor 102 is selected to be turned on and the case where the thin film transistor 102 is selected to be turned off is similar to Embodiment Mode 1. In FIG. 5B, an operation of the thin film transistor 107 in each of the case where the thin film transistor 102 is turned on and the case where the thin film transistor 102 is selected to be turned off is similar to Embodiment Mode 2. In FIG. 5C, an operation of the circuit 106 for setting a potential in each of the case where the thin film transistor 102 is selected to be turned on and the case where the thin film transistor 102 is selected to be turned off is similar to Embodiment Mode 3. In FIG. 5D, an operation of the thin film transistor 107 in each of the case where the thin film transistor 102 is selected to be turned on and the case where the thin film transistor 102 is selected to be turned off is similar to Embodiment Mode 4.

Embodiment 1 can be freely implemented in combination with embodiment modes.

[Embodiment 2]

Figures 6A, 6B:
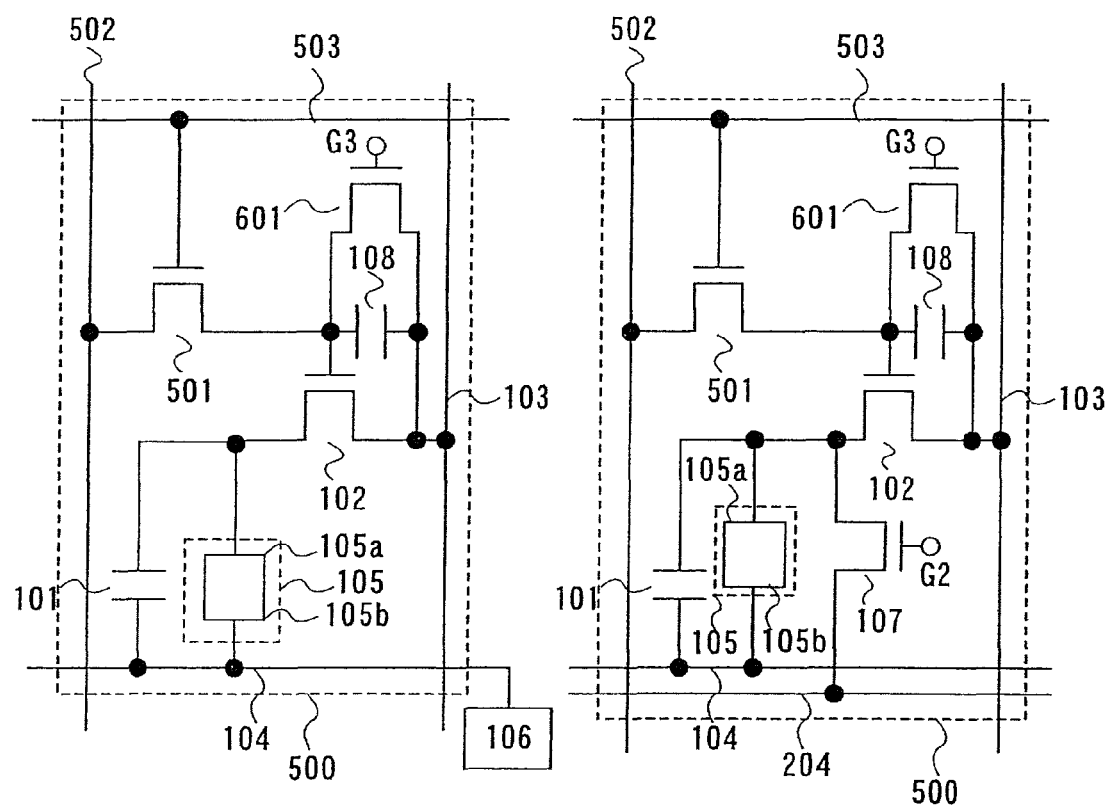
FIGS. 6A and 6B are diagrams showing Embodiment 2 of the invention.

A different example than the example of the pixel shown in Embodiment 1 is described with reference to FIGS. 6A and 6B. In FIGS. 6A and 6B, the same reference numerals are used for the same portions as in FIGS. 1A to 5D, and a description thereon is omitted.

FIG. 6A shows the configuration of FIG. 5C in which a circuit for selecting to turn off the thin film transistor 102 independent of a signal of the signal line 502 is provided. FIG. 6B shows the configuration of FIG. 5D in which a circuit for selecting to turn off the thin film transistor 102 independent of a signal of the signal line 502 is provided.

In FIGS. 6A and 6B, reference numeral 601 denotes a thin film transistor. One of a source and drain of the thin film transistor 601 is connected to one electrode of the capacitor 108 and the other is connected to the other electrode of the capacitor 108.

In the configurations shown in FIGS. 6A and 6B, the thin film transistor 601 is selected to be turned on by a potential G3 inputted to a gate thereof so that two electrodes of the capacitor 108 have approximately the same potentials. The charge held in the capacitor 108 is discharged, thereby a potential difference between the source and gate of the thin film transistor 102 becomes approximately zero. In this manner, the thin film transistor 102 is selected to be turned off.

According to the second configuration, when the thin film transistor 102 connected in series to the light emitting element 105 is selected to be turned off, the thin film transistor 107 is selected to be turned on. Accordingly, a timing to select to turn on the thin film transistor 601 and a timing to select to turn on the thin film transistor 107 in FIG. 6B can be the same. Therefore, the thin film transistors 107 and 601 can have the same polarity and gates thereof can be connected to the same wiring, thereby signals can be inputted thereto at the same time. A wiring for inputting a signal to the gate of the thin film transistor 107 and a wiring for inputting a signal to the gate of the thin film transistor 601 can be shared, which can improve an aperture ratio of pixels.

This embodiment mode can be freely implemented in combination with embodiment modes.

[Embodiment 3]

Figure 7A:
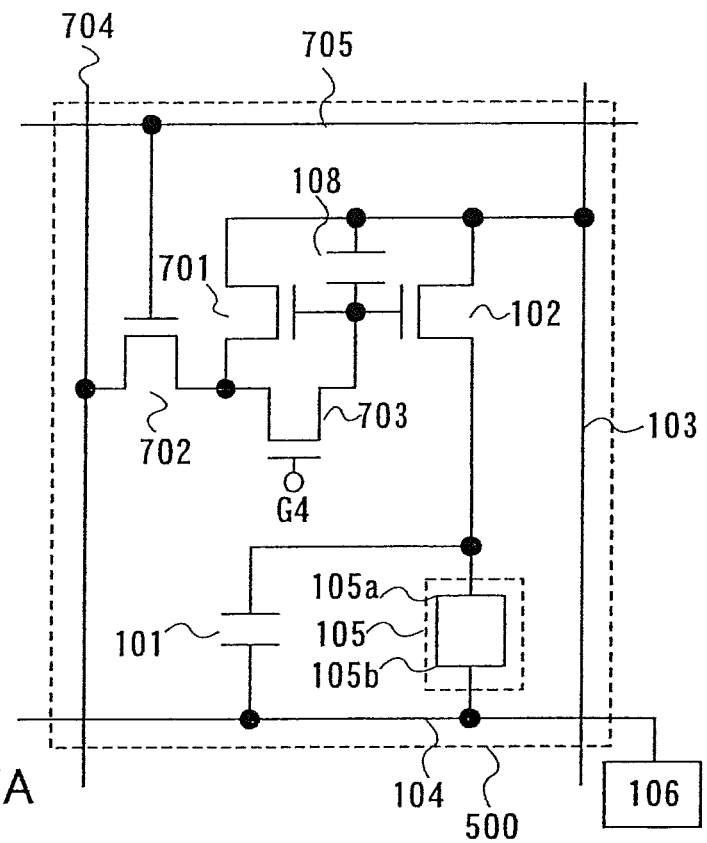
FIGS. 7A and 7B are diagrams showing Embodiment 3 of the invention.
Figure 7B:
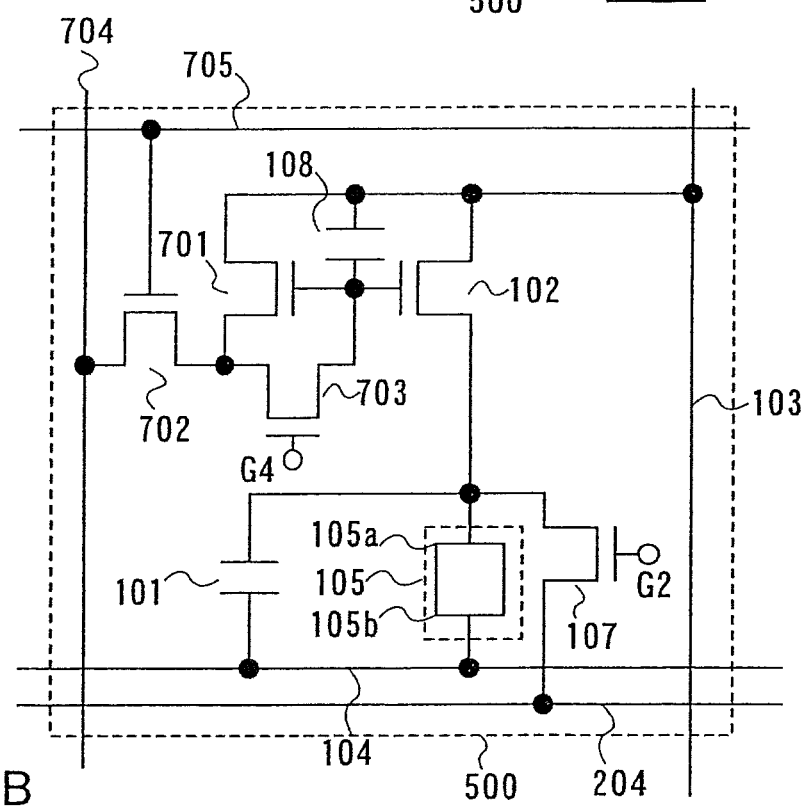

Another example than the examples of the pixel described in Embodiments 1 and 2 is described with reference to FIGS. 7A and 7B. In FIGS. 7A and 7B, the same reference numerals are used for the same portions as in FIGS. 1A to 6B.

FIG. 7A shows a specific example of a circuit for inputting the potential G1 to the gate of the thin film transistor 102 in the configuration of FIG. 3A. FIG. 7B shows a specific example of a circuit for inputting the potential G1 to the gate of the thin film transistor 102 in the configuration of FIG. 4A.

In FIGS. 7A and 7B, reference numerals 701, 702, and 703 denote thin film transistors, 704 denotes a signal line, and 705 denotes a scan line. One of a source and drain of the thin film transistor 702 is connected to the signal line 704 and the other is connected to one of a source and drain of the thin film transistor 701 and one of a source and drain of the thin film transistor 703. A gate of the thin film transistor 702 is connected to the scan line 705. The other of the source and drain of the thin film transistor 701 is connected to the first power source line 103. The other of the source and drain of the thin film transistor 703 is connected to the gate of the thin film transistor 102. A gate of the thin film transistor 701 is connected to the gate of the thin film transistor 102.

In FIGS. 7A and 7B, the thin film transistor 703 is provided on the path between the gate of the thin film transistor 102 and one of the source and drain of the thin film transistor 701, however, it may be provided in another place such as on the path between the gate of the thin film transistor 701 and the second capacitor 108.

In the configurations shown in FIGS. 7A and 7B, the thin film transistor 702 is selected to be turned on by a signal inputted to the scan line 705, and the thin film transistor 703 is selected to be turned on by the potential G4 inputted to the gate thereof, thereby a voltage corresponding to the signal inputted to the signal line 704 is held in the capacitor 108. In this manner, on/off of the thin film transistor 102 and a value of a drain current thereof when turned on are controlled.

Operations of the pixels having the configurations shown in FIGS. 7A and 7B are further described. The signal line 704 is inputted with a current having a predetermined current value (hereinafter referred to as a signal current). When the thin film transistors 702 and 703 are selected to be turned on, a signal current flows through the thin film transistors 702 and 703 to charge the capacitor 108. In this manner, a voltage (hereinafter referred to as a voltage corresponding to the signal current) is held in the capacitor 108 so that the thin film transistor 701 supplies a drain current of the same amount as the signal current. A potential difference between the gate and source of the thin film transistor 701 and a potential difference between the gate and source of the thin film transistor 102 are equal. Provided that the thin film transistors 701 and 102 have the same polarity, approximately equal ratios of channel width to channel length, and approximately the same characteristics, the thin film transistor 102 supplies a drain current of approximately the same amount as the signal current. In this manner, a current supplied to the light emitting element 105 is controlled to perform a display.

After the thin film transistor 702 is selected to be turned off and a signal current is not inputted from the signal line to the pixel, a voltage corresponding to the signal current is held in the capacitor 108. Accordingly, even after the signal current is not inputted from the signal line to the pixel, the thin film transistor 102 supplies a drain current of approximately the same amount as the signal current. It is to be noted that it is preferable that the thin film transistor 703 be selected to be turned off before or at the same time as the thin film transistor 702 is selected to be turned off. If the thin film transistor 702 is selected to be turned off with the thin film transistor 703 being on, a charge held in the capacitor 108 is discharged and a voltage corresponding to the signal current cannot be held anymore.

The thin film transistors 702 and 703 can be selected to be turned on/off at the same time. Accordingly, the thin film transistors 702 and 703 can have the same polarity and the gate of the thin film transistor 703 can be connected to the scan line 705. A wiring for inputting a signal to the gate of the thin film transistor 702 and a wiring for inputting a signal to the gate of the thin film transistor 703 can be shared, which can improve an aperture ratio of pixels.

In FIG. 7A, an operation of the circuit 106 for setting a potential in each of the case where the thin film transistor 102 is selected to be turned on and the case where the thin film transistor 102 is selected to be turned off is similar to Embodiment Mode 3. In FIG. 7B, an operation of the thin film transistor 107 in each of the case where the thin film transistor 102 is selected to be turned on and the case where the thin film transistor 102 is selected to be turned off is similar to Embodiment Mode 4.

Embodiment 3 can be freely implemented in combination with embodiment modes.

[Embodiment 4]

Figure 10:
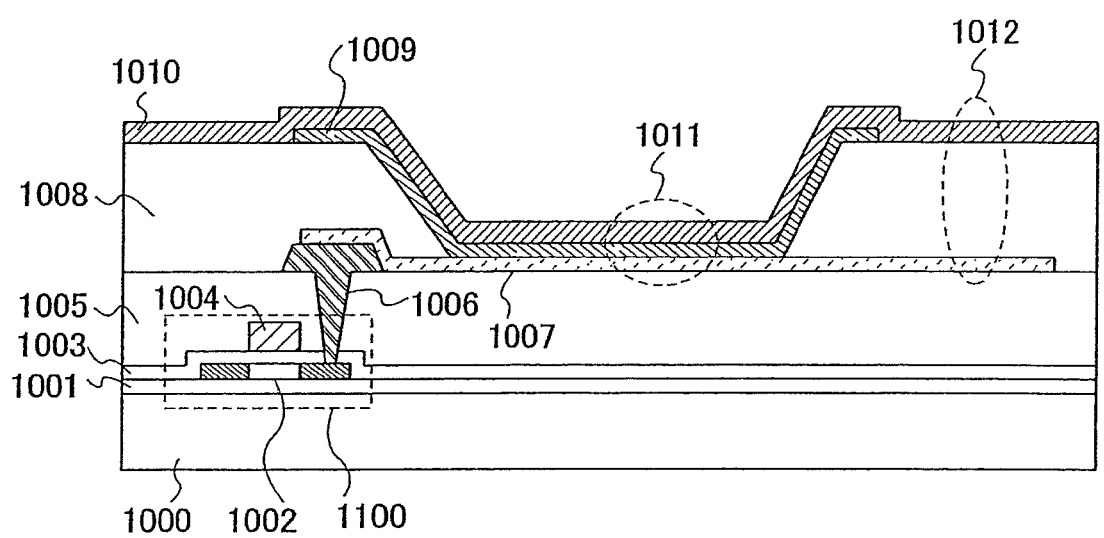
FIG. 10 is a diagram showing Embodiment 4.

A specific example of a pixel configuration is described. FIG. 10 is a cross sectional diagram showing a pixel configuration of the invention. Reference numeral 1000 denotes a substrate, 1001 denotes a base film, 1002 denotes a semiconductor layer, 1003 denotes a first insulating film, 1004 denotes a gate electrode, 1005 denotes a second insulating film, 1006 denotes an electrode, 1007 denotes a first electrode, 1008 denotes a third insulating film, 1009 denotes a light emitting layer, and 1010 denotes a second electrode. Reference numeral 1100 denotes a thin film transistor, 1011 denotes a light emitting element, and 1012 denotes a capacitor.

The substrate 1000 may be formed of a glass substrate such as a barium borosilicate glass and aluminoborosilicate glass, a quartz substrate, a ceramic substrate and the like. Further, a metal substrate containing stainless steel or a semiconductor substrate each of which has an insulating film over the surface may be used as well. A substrate formed of a flexible synthetic resin such as plastic may also be used. A surface of the substrate 1000 may be planarized by polishing by a CMP method and the like.

The base film 1001 may be formed of an insulating film such as silicon oxide, silicon nitride or silicon nitride oxide. By providing the base film 1001, it can be prevented that an alkaline metal such as Na and an alkaline earth metal in the substrate 1000 are dispersed into the semiconductor layer 1002 and adversely affect characteristics of the thin film transistor 1100. In FIG. 10, the base film 1001 has a single layer structure; however, two layers or a plurality of layers more than two may be formed as well. It is to be noted that the base film 1001 is not necessarily provided in the case where the dispersion of impurities is not a big problem, such as the case of using a quartz substrate.

The semiconductor layer 1002 may be formed of a patterned crystalline semiconductor film or amorphous semiconductor film. The crystalline semiconductor film can be obtained by crystallizing an amorphous semiconductor film. A crystallizing method may be a laser crystallizing method, a thermal crystallizing method using RTA or an annealing furnace, a thermal crystallizing method using a metal catalyst which promotes crystallization and the like. The semiconductor layer 1002 has a channel forming region and a pair of impurity regions which are added impurity elements which impart conductivity. It is to be noted that an impurity region which is added impurity elements at a low concentration may be provided between the channel forming region and the pair of impurity regions.

The first insulating film 1003 can be formed of a single layer or a plurality of stacked layers, using silicon oxide, silicon nitride or silicon nitride oxide and the like.

The gate electrode 1004 can be formed of a single layer structure or a stacked-layer structure of an alloy or compound containing one or a plurality of elements selected from Ta, W, Ti, Mo, Al, Cu, Cr, and Nd. For example, stacked layers of TaN and W can be used as the gate electrode 1004. A semiconductor film represented by a polycrystalline silicon film which is added impurity elements which imparts conductivity may be used as well.

The thin film transistor 1100 is formed of the semiconductor layer 1002, the gate electrode 1004, and the first insulating film 1003 between the semiconductor layer 1002 and the gate electrode 1004. In FIG. 10, only the thin film transistor 1100 connected to the first electrode 1007 of the light emitting element 1011 is shown, however, a plurality of thin film transistors may be provided as well. Moreover, the thin film transistor 1100 is shown as a top gate transistor in this embodiment, however, a bottom gate transistor having a gate electrode beneath the semiconductor layer or a dual gate transistor having gate electrodes above and beneath the semiconductor layer may be employed as well.

The second insulating film 1005 may be formed of a single layer or stacked layers of an inorganic insulating film and an organic insulating film. As the inorganic insulating film, a silicon oxide film formed by a CVD method, a SOG (Spin On Glass) method and the like can be used. As the organic insulating film, a film such as polyimide, polyamide, BCB (benzocyclobutene), acrylic or a positive photosensitive organic resin, and a negative photosensitive organic resin can be used.

Further, a material having a backbone structure of Si (silicon)-O (oxygen) bond can be used for the second insulating film 1005 as well. As a substituent for this material, an organic group (for example and an alkyl group, aromatic carbon hydride) containing at least hydrogen is used. As the substituent, a fluoro group may be used as well. Moreover, a fluoro group and an organic group containing at least hydrogen may also be used.

The electrode 1006 may be formed of a single layer structure or a stacked-layer structure of an alloy containing one or a plurality of elements selected from Al, Ni, C, W, Mo, Ti, Pt, Cu, Ta, Au, and Mn. For example, a metal film Ti/Al/Ti formed by stacking Al and Ti can be used as the electrode 1006. Further, an end portion of the electrode 1006 formed over the second insulating film 1005 may be tapered, which can prevent a break of a film formed thereover.

One or both of the first electrode 1007 and the second electrode 1010 can be a light transmissive electrode. As the light transmissive electrode, a light transmissive oxide conductive material such as indium tin oxide (ITO), zinc oxide (ZnO), indium zinc oxide (IZO), and zinc oxide which is added gallium (GZO) can be used. Alternatively, ITO and ITO containing silicon (hereinafter referred to as ITSO), ITO and ITO containing titanium oxide (hereinafter referred to as ITTO), ITO and ITO containing molybdenum oxide (hereinafter referred to as ITMO), ITO which is added titanium, molybdenum, or gallium, and indium oxide containing silicon oxide which is added 2 to 20% of zinc oxide (ZnO) may be used as well.

The other of the first electrode 1007 and the second electrode 1010 may be formed of a material which does not transmit light. For example, an alkaline metal such as Li and Cs, an alkaline earth metal such as Mg, Ca, and Sr, an alloy containing these (Mg:Ag, Al:Li, Mg:In and the like) and a compound thereof ($CaF_2$ and calcium nitride), and a rare earth metal such as Yb and Er can be used.

The third insulating film 1008 can be formed using a similar material to that of the second insulating film 1005. The third insulating film 1008 is formed in the periphery of the first electrode 1007 so as to cover an end portion of the first electrode 1007, and functions as a bank for separating the light emitting layer 1009 between adjacent pixels.

The light emitting layer 1009 is formed of a single layer or a plurality of layers. In the case where the light emitting layer 1009 is formed of a plurality of layers, these layers can be categorized into a hole injecting layer, a hole transporting layer, a light emitting layer, an electron transporting layer, an electron injecting layer and the like in view of a carrier transporting property. It is to be noted that a boundary between each layer is not necessarily clear, but an interface may be unclear when materials forming each layer are partly mixed. For the each layer, an organic material and an inorganic material can be used. As the organic material, any one of a high molecular weight, medium molecular weight, and low molecular weight materials can be used. It is to be noted that the medium molecular weight material corresponds to an oligomer of which structure includes about 2 to 20 repetition (polymerization degree) of a single constitutional unit.

The light emitting element 1011 is formed of the light emitting layer 1009, and the first electrode 1007 and the second electrode 1010 with the light emitting layer 1009 interposed therebetween. One of the first electrode 1007 and the second electrode 1010 corresponds to an anode while the other corresponds to a cathode. The light emitting element 1011 emits light when a forward bias voltage higher than a threshold voltage thereof is applied between the anode and cathode thereof and a current flows from the anode to the cathode.

The capacitor 1012 is formed of the third insulating film 1008, and the first electrode 1007 and the second electrode 1010 with the third insulating film 1008 interposed therebetween. The capacitor 1012 corresponds to the capacitor in the third configuration of the invention, that is the capacitor 101 in embodiment modes and Embodiments 1 to 3.

This embodiment can be freely implemented in combination with embodiment modes and Embodiments 1 to 3.

[Embodiment 5]

A specific example of a pixel configuration which is different than Embodiment 4 is described. It is to be noted that the same portions as FIG. 10 are denoted by the same reference numerals and a description thereon is omitted.

Figure 11:
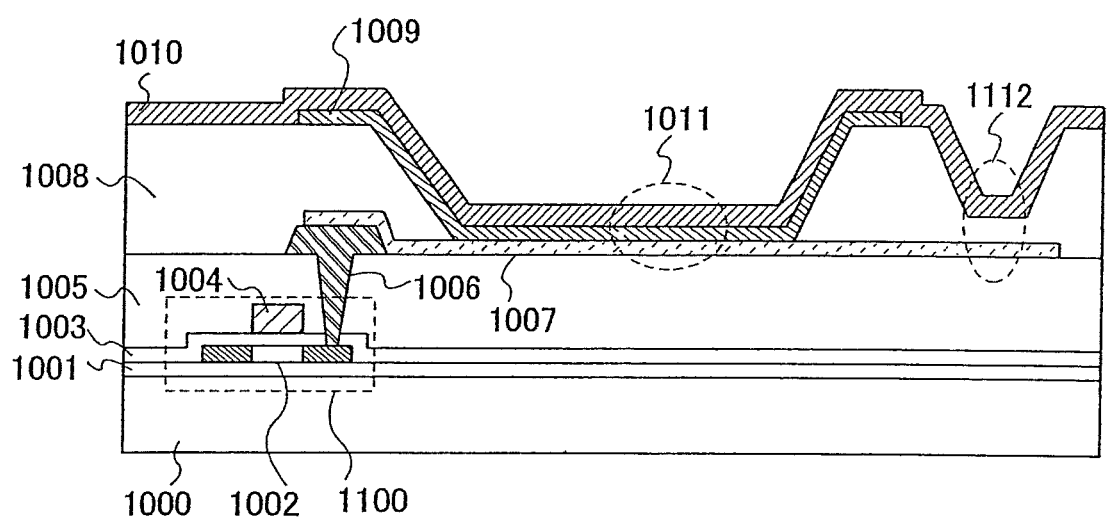
FIG. 11 is a diagram showing Embodiment 5.

In a configuration of FIG. 11, the third insulating film 1008 of a portion overlapped with the first electrode 1007 is formed thin. A capacitor 1112 is formed of the third insulating film 1008, and the first electrode 1007 and the second electrode 1010 with the third insulating film 1008 interposed therebetween. The capacitor 1112 corresponds to the capacitor in the third configuration of the invention, that is the capacitor 101 in embodiment modes and Embodiments 1 to 3. The capacitor 1112 requires a smaller area for an electrode to obtain the same capacitance compared to the capacitor 1012 of Embodiment 4. In this manner, an aperture ratio of pixels can be improved.

This embodiment can be freely implemented in combination with embodiment modes and Embodiments 1 to 3.

[Embodiment 6]

Figure 12A:
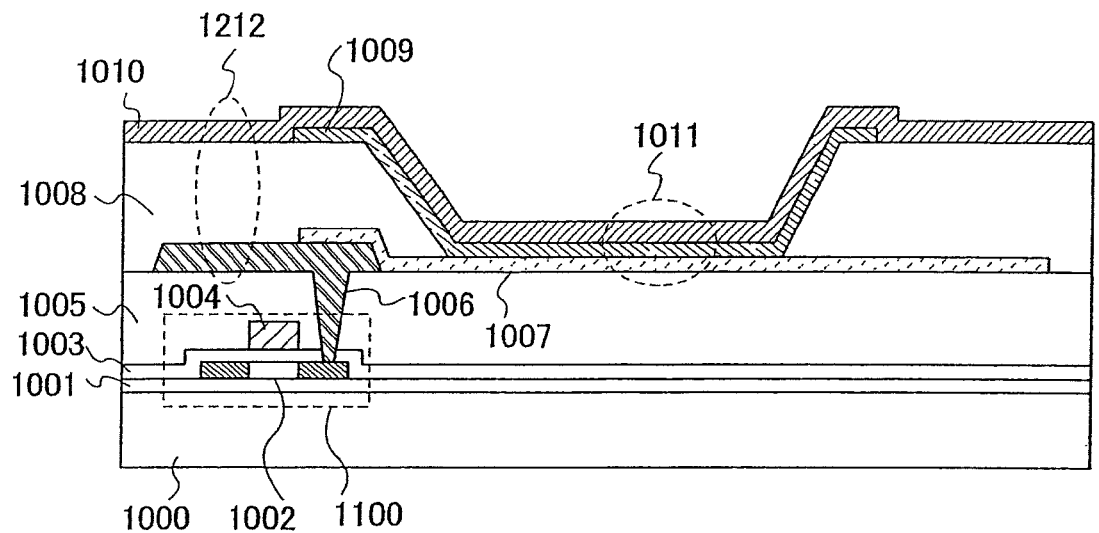
FIGS. 12A to 12C are diagrams showing Embodiment 6.
Figure 12B:
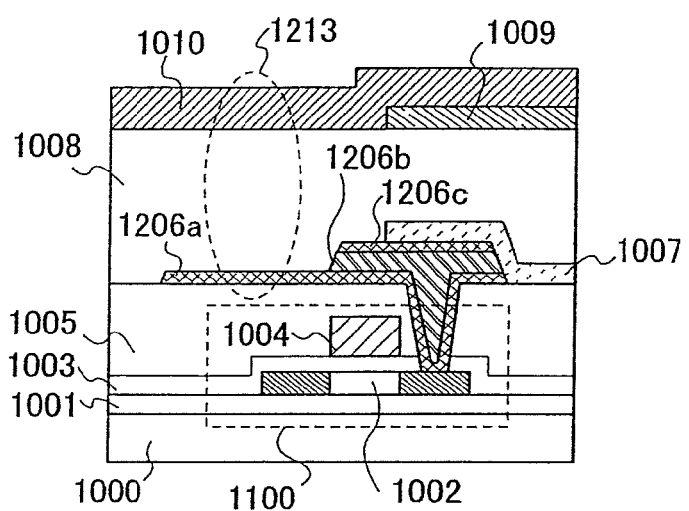
Figure 12C:
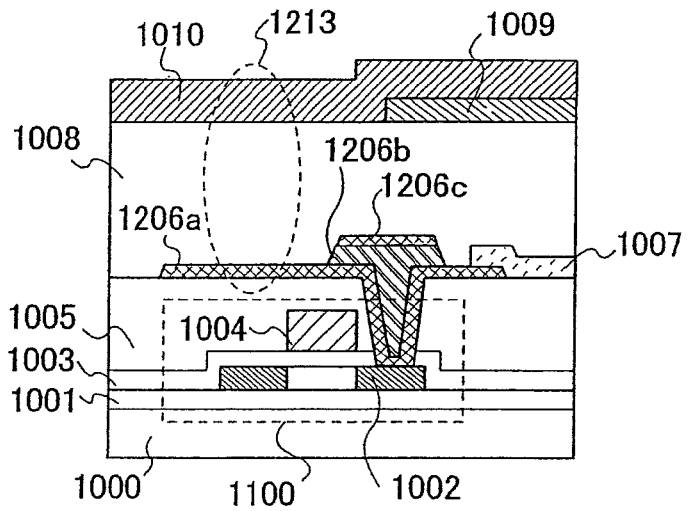

A specific example of a pixel configuration which is different than Embodiments 4 and 5 is described. Each of FIGS. 12A to 12C shows a cross sectional diagram showing a pixel configuration of the invention. It is to be noted, that the same portions as FIG. 10 are denoted by the same reference numerals and a description thereon is omitted.

In the configuration of FIG. 12A, the capacitor 1212 is formed of the third insulating film 1008, and the electrode 1006 and the second electrode 1010 with the third insulating film 1008 interposed therebetween. The capacitor 1212 corresponds to the capacitor in the third configuration of the invention, that is the capacitor 101 in embodiment modes and Embodiments 1 to 3.

As described in Embodiment 4, the electrode 1006 can be formed of stacked layers. Each of FIGS. 12B and 12C shows an example of the electrode 1006 having a stacked-layer structure. The electrode 1006 is formed of a first layer 1206a, a second layer 1206b, and a third layer 1206c. For example, Ti can be used for the first layer 1206a, Al can be used for the second layer 1206b, and Ti can be used for the third layer 1206c.

In FIGS. 12B and 12C, portions of the second layer 1206b and the third layer 1206c which are overlapped with the first layer 1206a are removed, and a portion of the first layer 1206a only remains (hereinafter referred to as an extended portion of the first layer 1206a). A capacitor 1213 is formed of the third insulating film 1008, and the extended portion of the first layer 1206a and the second electrode 1010 with the third insulating film 1008 interposed therebetween. The capacitor 1213 corresponds to the capacitor in the third configuration of the invention, that is the capacitor 101 in embodiment modes and Embodiments 1 to 3.

As the capacitor 1213 is formed in the extended portion of the first layer 1206a without the second layer 1206b in the configurations of FIGS. 12B and 12C, a defect such as a short-circuit between electrodes can be reduced even when the second layer 1206b has poor planarity. Accordingly, the configurations shown in FIGS. 12B and 12C are effective in particular in the case where a material having a relatively low electric resistance but poor planarity is used for the second layer 1206b and a material having a relatively high electric resistance but good planarity is used for the first layer 1206a and the third layer 1206c. For example, these configurations are effective in the case where Al is used for the second layer 1206b and Ti is used for the first layer 1206a and the third layer 1206c.

In FIG. 12C, the first layer 1206a and the first electrode 1007 are connected at the extended portion of the first layer 1206a. The electrode 1006 of a portion overlapped with the first electrode 1007 is formed thin, which can prevent a break of the first electrode 1007 and ensure a connection between the first electrode 1007 and the electrode 1006.

This embodiment can be freely implemented in combination with embodiment modes and Embodiments 1 to 5.

[Embodiment 7]

A specific example of a pixel having a different configuration than Embodiments 4 to 6 is described. FIG. 13 is a cross sectional diagram showing a pixel configuration of the invention. It is to be noted that the same portions as FIGS. 10A to 12C are denoted by the same reference numerals and a description thereon is omitted.

Figure 13A:
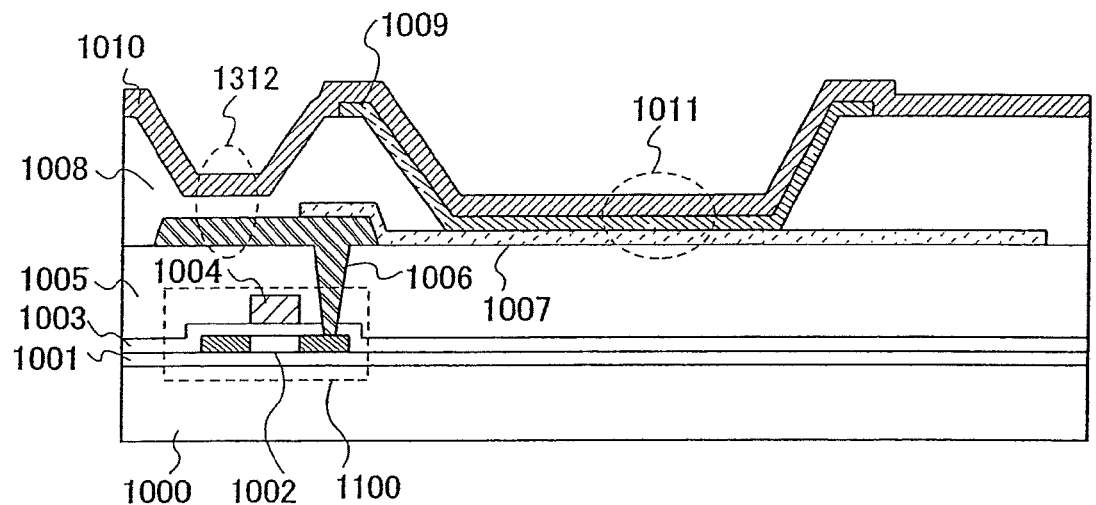
FIGS. 13A to 13C are diagrams showing Embodiment 7.

In the configuration of FIG. 13A, the third insulating film 1008 of a portion overlapped with the electrode 1006 (or the extended portion of the first layer 1206a) is formed thin. A capacitor 1312 is formed of the third insulating film 1008, and the electrode 1006 and the second electrode 1010 with the third insulating film 1008 interposed therebetween. The capacitor 1312 corresponds to the capacitor in the third configuration, that is the capacitor 101 in embodiment modes and Embodiments 1 to 3. The capacitor 1312 requires a smaller area for an electrode to obtain the same capacitance, which can improve an aperture ratio of pixel.

Figure 13B:
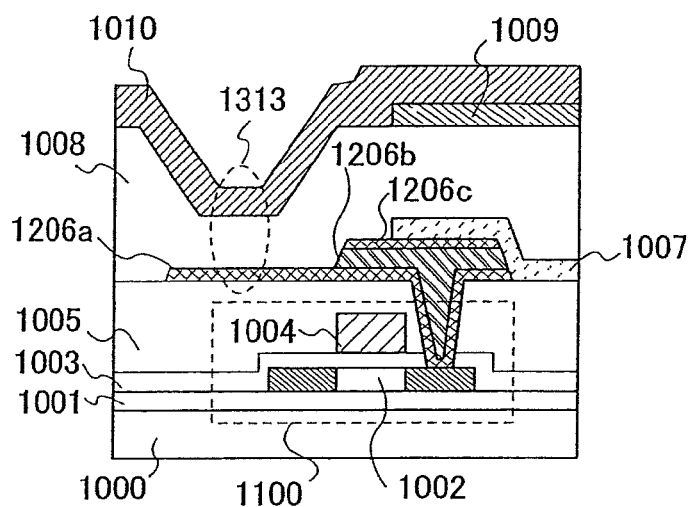
Figure 13C:
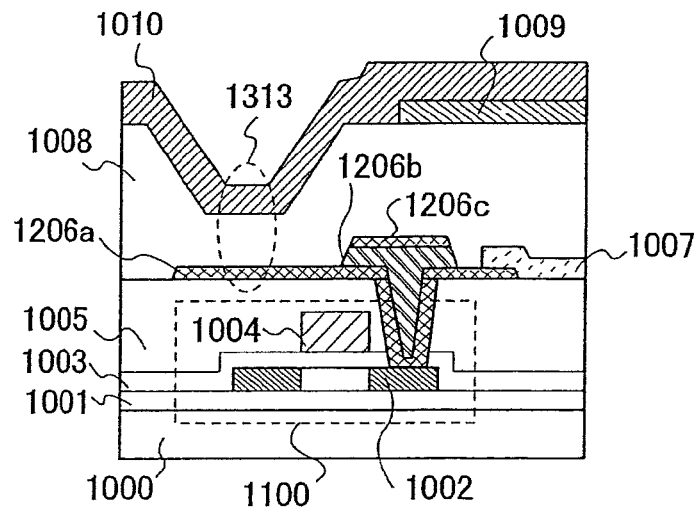

In FIGS. 13B and 13C, a capacitor 1313 is formed of the third insulating film 1008, and the extended portion of the first layer 1206a and the second electrode 1010 with the third insulating film 1008 interposed therebetween. The capacitor 1313 corresponds to the capacitor in the third configuration of the invention, that is the capacitor 101 in embodiment modes and Embodiments 1 to 3.

In FIG. 13C, the first layer 1206a and the first electrode 1007 are connected at the extended portion of the first layer 1206a.

Effects of FIGS. 13B and 13C are similar to those of FIGS. 12B and 12C of Embodiment 6. Further, the capacitor 1313 in FIGS. 13B and 13C requires a smaller area for an electrode to obtain the same capacitance as compared to the capacitor 1213 in FIGS. 12B and 12C. In this manner, an aperture ratio of pixel can be improved.

This embodiment can be freely implemented in combination with embodiment modes and Embodiments 1 to 5.

[Embodiment 8]

Figure 14A:
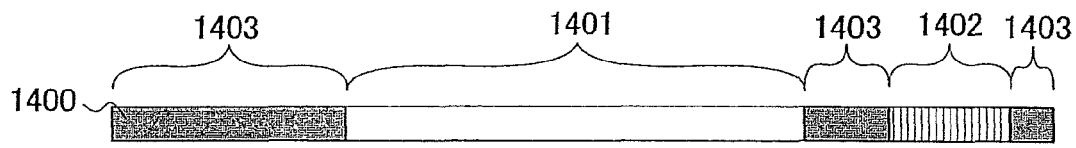
FIGS. 14A to 14C are diagrams showing Embodiment 8.
Figure 14B:
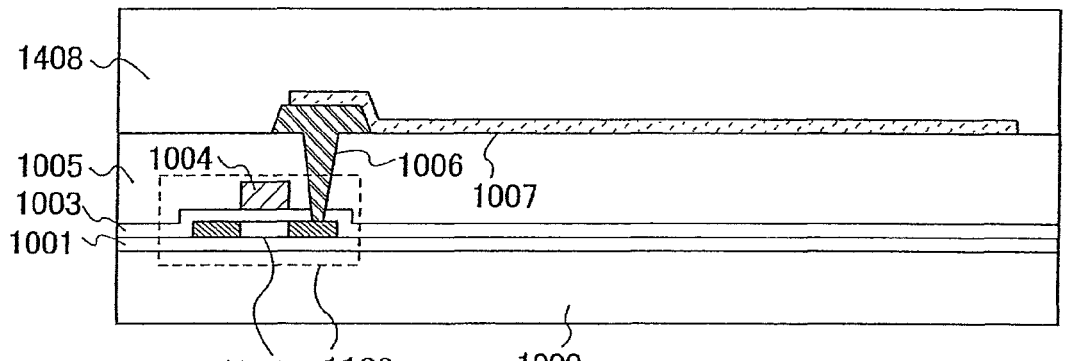
Figure 14C:
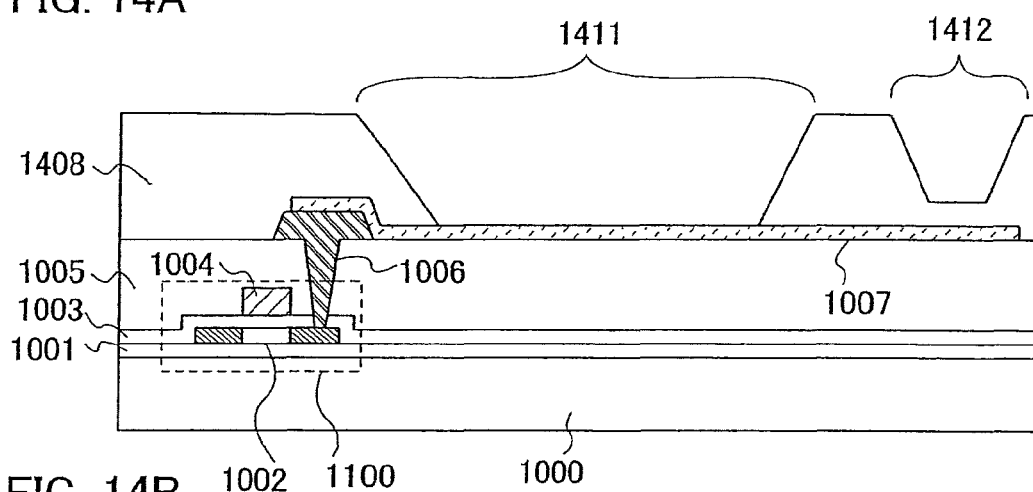

Description is made with reference to FIGS. 14A to 14C on a manufacturing method of the third insulating film 1008 of which portion is formed thin described in Embodiments 5 and 7. In FIGS. 14A to 14C, the same portions as in FIG. 11 are denoted by the same reference numerals and a description thereon is omitted.

In FIG. 14A, after forming the first electrode 1007, an insulating film 1408 is formed. A photosensitive material is used for the insulating film 1408. The insulating film 1408 is exposed by using a photo mask 1400. The photo mask 1400 is provided with a first light transmissive portion 1401, a second light transmissive portion 1402, and a light shielding portion 1403. The first light transmissive portion 1401 may be an aperture. The intensity of light transmitting through the photo mask 1400 is lower in the second light transmissive portion 1402 than in the first light transmissive portion 1401. The light shielding portion 1403 does not transmit light almost at all. A half-tone mask as described above is used as the photo mask 1400.

In FIG. 14B, the insulating film 1408 is developed. The insulating film 1408 of a portion overlapped with the light shielding portion 1403 is barely etched. The insulating film 1408 of a portion exposed through the first light transmissive portion 1401 is largely etched. In this manner, an aperture portion 1411 in which a surface of the first electrode 1007 is exposed is formed. The insulating film 1408 of a portion exposed through the second light transmissive portion 1402 is etched to some extent. In this manner, a thin portion 1412 is formed in the insulating film 1408. In this manner, the insulating film 1408 having a thin portion is obtained. The insulating film 1408 in FIG. 14B corresponds to the third insulating film 1008 described in Embodiments 5 and 7.

In FIG. 14C, the light emitting layer 1009 and the second electrode 1010 are sequentially formed.

This embodiment can be freely implemented in combination with embodiment modes and Embodiments 1 to 7.

[Embodiment 9]

Figure 15A:
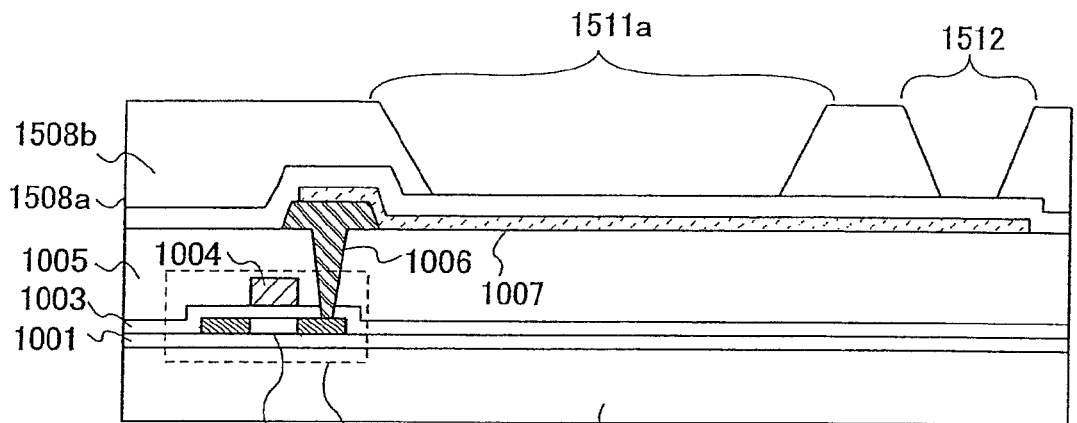
FIGS. 15A to 15C are diagrams showing Embodiment 9.
Figure 15B:
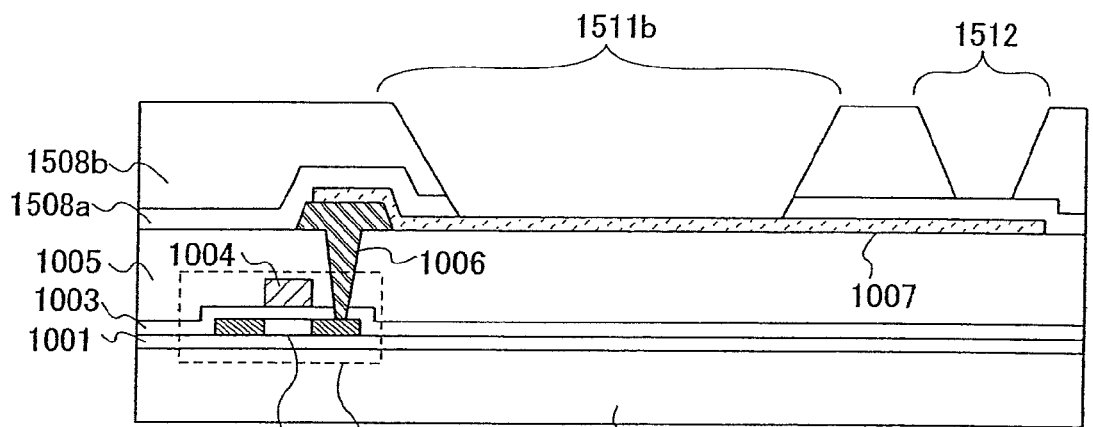
Figure 15C:
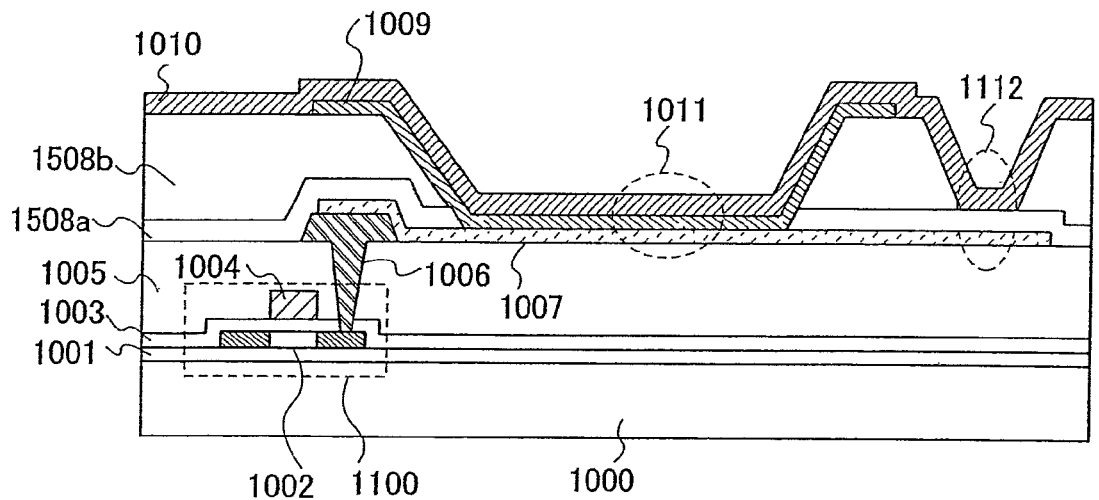

Description is made with reference to FIGS. 15A to 15C on a manufacturing method of the third insulating film 1008 of which portion is formed thin described in Embodiments 5 and 7, which is different than the method described in Embodiment 8. In FIGS. 15A to 15C, the same portions as FIG. 11 are denoted by the same reference numerals and a description thereon is omitted.

In FIG. 15A, after forming the first electrode 1007, an insulating film 1508a is formed. An insulating film 1508b is formed over the insulating film 1508a. A single layer or stacked layers of an inorganic insulating film and an organic insulating film can be used as the insulating films 1508a and 1508b. Further, a material having a backbone structure of a Si (silicon)-O (oxygen) bond can be used as well. As a substituent for this material, an organic group (for example, an alkyl group and aromatic carbon hydride) containing at least hydrogen is used. As the substituent, a fluoro group may be used as well. Moreover, a fluoro group and an organic group containing at least hydrogen may also be used.

The insulating film 1508b is etched to form the first aperture portion 1511a and the second aperture portion 1512.

In FIG. 15B, the insulating film 1508a is etched in the first aperture portion 1511a to form a third aperture portion 1511b. In this manner, the third aperture portion 1511b in which a surface of the first electrode 1007 is exposed and a second aperture portion 1512 in which a surface of the insulating film 1508a is exposed can be obtained. The patterned insulating films 1508a and 1508b correspond to the third insulating film 1008 described in Embodiments 5 and 7. In this manner, the third insulating film 1008 having a thin portion is obtained.

In FIG. 15C, the light emitting layer 1009 and the second electrode 1010 are sequentially formed.

The capacitor 1112 has capacitance with the insulating film 1508a as a dielectric substance; therefore, the insulating film 1508a preferably has a high dielectric material such as a silicon nitride film, for example.

This embodiment can be freely implemented in combination with embodiment modes and Embodiments 1 to 7.

[Embodiment 10]

The display device and the driving method of the invention can be applied to various electronic devices each having the display device incorporated in a display portion thereof.

The electronic devices include a camera (a video camera, a digital camera and the like), a projector, a head mounted display (a goggle type display), a navigation system, a car stereo set, a personal computer, a game machine, a portable information terminal (a mobile computer, a portable phone, an electronic book or the like), an image reproducing device provided with a recording medium (specifically, a device which reproduces a recording medium such as a DVD (Digital Versatile Disc) and has a display which can display the reproduced image), and the like. Examples of the electronic devices are shown in FIGS. 9A to 9D.

Figure 9A:
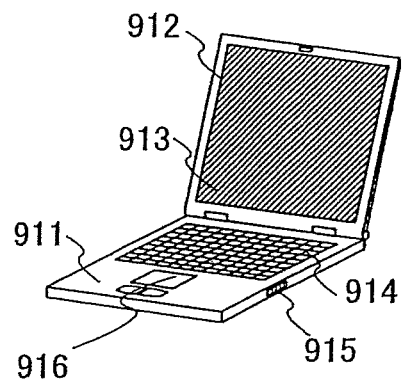
FIGS. 9A to 9D are diagrams showing Embodiment 10 of the invention.

FIG. 9A illustrates a notebook personal computer including a main body 911, a housing 912, a display portion 913, a keyboard 914, an external connecting port 915, a pointing pad 916 and the like. The display device and driving method thereof of the invention are applied to the display portion 913. By using the invention, a clear display of the display portion 913 with a higher contrast can be realized with less power consumption. It is quite effective to apply the invention to the notebook personal computer which requires a reduction in power consumption.

Figure 9B:
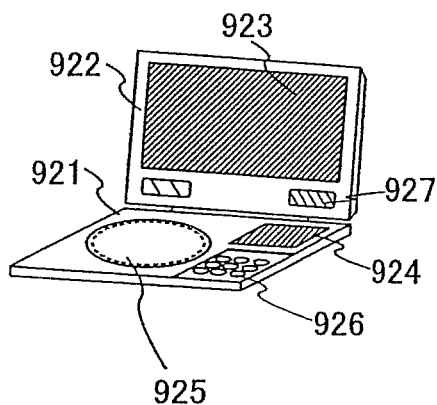

FIG. 9B illustrates an image reproducing device provided with a recording medium (specifically a DVD reproducing device), including a main body 921, a housing 922, a first display portion 923, a second display portion 924, a recording medium (a DVD and the like) reading portion 925, an operating key 926, a speaker portion 927 and the like. The first display portion 923 mainly displays image data while the second display portion 924 mainly displays text data. The display device and driving method thereof of the invention are applied to the first display portion 923 and the second display portion 924. By using the invention, a clear display of the first display portion 923 and the second display portion 924 with a higher contrast can be realized with less power consumption.

Figure 9C:
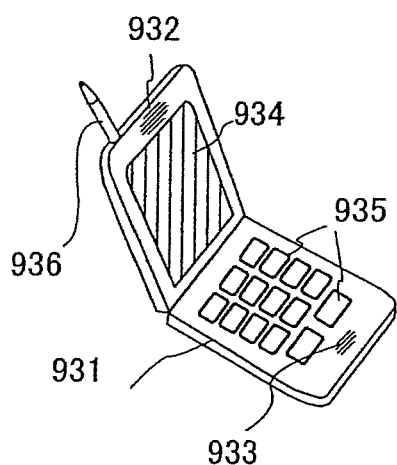

FIG. 9C illustrates a portable phone including a main body 931, an audio output portion 932, an audio input portion 933, a display portion 934, operating switches 935, an antenna 936 and the like. The display device and driving method thereof of the invention are applied to the display portion 934. By using the invention, a clear display of the display portion 934 with a higher contrast can be realized with less power consumption. It is quite effective to apply the invention to the portable phone which requires a reduction in power consumption.

Figure 9D:
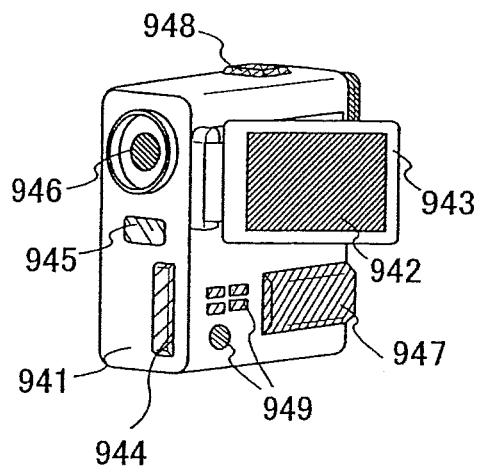

FIG. 9D illustrates a camera including a main body 941, a display portion 942, a housing 943, an external connecting port 944, a remote control receiving portion 945, an image receiving portion 946, a battery 947, an audio input portion 948, operating keys 949 and the like. The display device and driving method of the invention are applied to the display portion 942. By using the invention, a clear display of the display portion 942 with a higher contrast can be realized with less power consumption.

This embodiment mode can be freely implemented in combination with embodiment modes and Embodiments 1 to 9.

This application is based on Japanese Patent Application serial no. 2004-270477 filed in Japan Patent Office on 16th, Sep., 2004, the entire contents of which are hereby incorporated by reference.

What is claimed is:

1. A display device comprising:
   a transistor;
   a first electrode electrically connected to the transistor;
   an insulating layer over the first electrode;
   a light-emitting layer over the first electrode; and
   a second electrode over the light-emitting layer and the insulating layer,
   wherein the insulating layer has a first region and a second region,
   wherein a thickness of the insulating layer in the first region is smaller than a thickness of the insulating layer in the second region,
   wherein an upper surface of the insulating layer in the first region is lower than an upper surface of the insulating layer in the second region, and
   wherein the first region of the insulating layer is not overlapped with the light-emitting layer.

2. The display device according to claim 1, wherein the transistor is over a plastic.

3. The display device according to claim 1,
   wherein the transistor is a p-channel transistor.

4. The display device according to claim 1,
   wherein the transistor is an n-channel transistor.

5. The display device according to claim 1,
   wherein the first region of the insulating layer overlaps with the first electrode.

6. The display device according to claim 1,
   wherein the insulating layer comprises an organic insulating layer.

7. An electronic device comprising the display device according to claim 1.

8. An electronic device comprising the display device according to claim 1 and at least any one of an operation key, a speaker and an antenna.

9. The display device according to claim 1, wherein the first region of the insulating layer does not overlap with the transistor.

10. The display device according to claim 1, wherein the second region of the insulating layer is overlapped with the transistor.

11. A display device comprising:
a transistor;
a first electrode electrically connected to the transistor;
a first insulating layer over the first electrode;
a second insulating layer over the first insulating layer;
a light-emitting layer over the first electrode and the second insulating layer; and
a second electrode over the light-emitting layer, the first insulating layer and the second insulating layer,
wherein the first insulating layer has a first region and a second region,
wherein the first region of the first insulating layer is covered by the second insulating layer,
wherein the second region of the first insulating layer is not covered by the second insulating layer, and
wherein the second region of the first insulating layer is not overlapped with the light-emitting layer.

12. The display device according to claim 11, wherein each of the first insulating layer and the second insulating layer comprises an organic insulating layer.

13. The display device according to claim 11, wherein the second region of the first insulating layer overlaps with the first electrode.

14. The display device according to claim 11, wherein the first region of the first insulating layer overlaps with the transistor.

15. An electronic device comprising the display device according to claim 11.

16. An electronic device comprising the display device according to claim 11 and at least any one of an operation key, a speaker and an antenna.

17. The display device according to claim 11, wherein the second region of the first insulating layer does not overlap with the transistor.

18. The display device according to claim 11, wherein the transistor is a p-channel transistor.

19. The display device according to claim 11, wherein the transistor is an n-channel transistor.

20. The display device according to claim 11, wherein the first region of the first insulating layer is overlapped with the transistor.

21. The display device according to claim 11, wherein the transistor is over a plastic.

* * * * *